(12) United States Patent
Prosch et al.

(10) Patent No.: US 7,895,496 B2
(45) Date of Patent: Feb. 22, 2011

(54) TRANSMITTER FOR TRANSMITTING INFORMATION DATA AND RECEIVER FOR RECEIVING INFORMATION DATA

(75) Inventors: Markus Prosch, Erlangen (DE); Alexander Zink, Stegaurach (DE); Bernd Linz, Erlangen (DE)

(73) Assignee: Fraunhofer-Gesellschaft zur Foerderung der Angewandten Forschung E.V., Munich (DE)

( * ) Notice: Subject to any disclaimer, the term of this patent is extended or adjusted under 35 U.S.C. 154(b) by 970 days.

(21) Appl. No.: 11/724,900

(22) Filed: Mar. 16, 2007

(65) Prior Publication Data

US 2007/0250752 A1 Oct. 25, 2007

Related U.S. Application Data

(63) Continuation of application No. PCT/EP2005/007310, filed on Jul. 6, 2005.

(30) Foreign Application Priority Data

Sep. 16, 2004 (DE) ........................ 10 2004 045 000

(51) Int. Cl.
*H03M 13/00* (2006.01)
*G06F 11/00* (2006.01)

(52) U.S. Cl. ...................................... 714/752; 714/701

(58) Field of Classification Search ................ 714/701, 714/746, 752
See application file for complete search history.

(56) References Cited

U.S. PATENT DOCUMENTS

| 4,604,655 | A | * | 8/1986 | Moriyama | .................... | 386/100 |
| 5,506,825 | A | * | 4/1996 | Gushima et al. | .............. | 386/96 |
| 7,111,222 | B2 | * | 9/2006 | Takagi et al. | ................. | 714/755 |
| 7,177,658 | B2 | | 2/2007 | Willenegger et al. | ......... | 455/522 |

FOREIGN PATENT DOCUMENTS

| DE | 19940265 | 3/2001 |
| EP | 1014730 | 6/2000 |
| WO | WO03107581 | 12/2003 |
| WO | WO2005050901 | 6/2005 |

OTHER PUBLICATIONS

Liebl, G. et al., "An RTP Payload Format for Erasure-Resilient Transmission of Progressive Multimedia Streams." Internet Engineering Tasks Force, Unequal Erasure Protection, Oct. 2003, 25 pages.

(Continued)

*Primary Examiner*—Shelly A Chase
(74) *Attorney, Agent, or Firm*—Michael A. Glenn; Glenn Patent Group

(57) ABSTRACT

A transmitter for transmitting information data present in a plurality of data sets comprises an assigner for assigning offset information to one or more data sets of the plurality of data sets, the offset information indicating where the data set is to be written in a memory of a receiver. Furthermore, the transmitter comprises a transmitting unit for transmitting a plurality of data sets and the offset information associated with the data set. Hereby, it is possible to effect improved error correction as opposed to the prior art.

30 Claims, 12 Drawing Sheets

OTHER PUBLICATIONS

Boyce, J.M., "Packet loss resilient transmission of MPEG video over the Internet—Principles, Protocols, and Architecture." Signal Processing Image Communication 15 (1999) 7-24.

Horn, U. et al., "Robust internet video transmission based on scalable coding and unequal error protection." Signal Processing Image Communication 15 (1999) 77-94.

Rosenberg, J. et al., "An RTP payload format for generic forward error correction." Network Working Group, Columbia University (Dec. 1999), 25 pages.

Ramsey, John L., "Realization of Optimum Interleavers" IEEE Transations on Information Theory, vol. iT-16, No. 3, 338-346, May 1970.

* cited by examiner

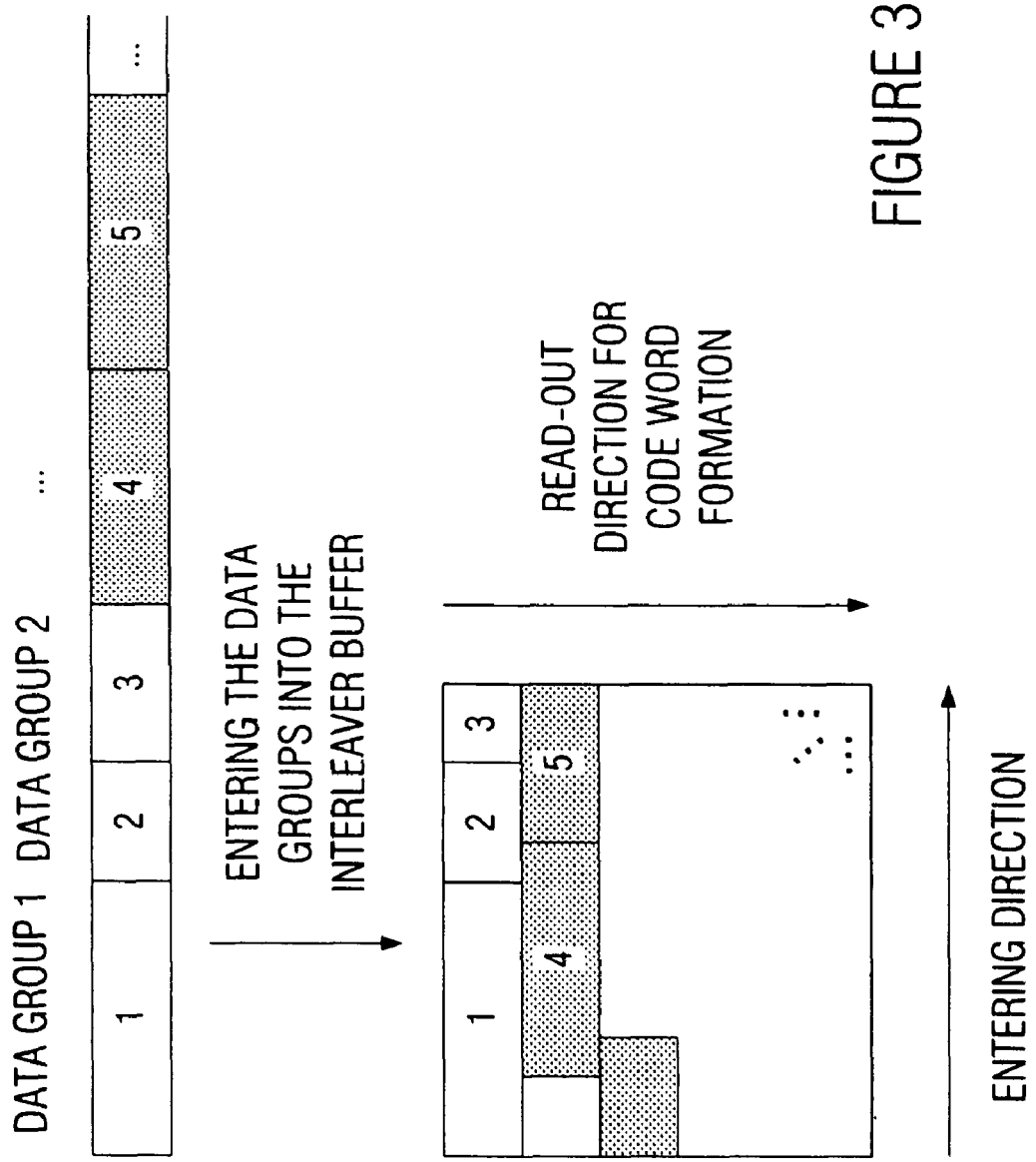

TRANSMITTER FOR TRANSMITTING INFORMATION DATA AND RECEIVER FOR RECEIVING INFORMATION DATA

CROSS-REFERENCE TO RELATED APPLICATION

This application is a continuation of co-pending International Application No. PCT/EP2005/007310, filed Jul. 6, 2005, which designated the United States and was not published in English and is incorporated herein by reference in its entirety.

BACKGROUND OF THE INVENTION

1. Field of the Invention

The present invention concerns the technical field of digital message transmission, and the present invention particularly concerns the technical field of digital radio broadcasting.

2. Description of the Related Art

Error protection mechanisms have been employed for quite some time to recognize and eliminate errors in data transmission. By the employment of digital radio broadcasting systems, many sources of errors of the analog systems could be excluded. Transmission errors, however, cannot be avoided. Radio transmission systems are generally more disturbance-prone than cable-bound systems, since the influences of the environment during the transmission path have some effect and influence the signal quality more, and an additional request for data is not possible owing to unidirectionality of these systems. Transmission errors may cause a loss of parts of the message, and hence a reception failure. With singular disturbances, reception of the message may also occur in errored and hence corrupted form.

Error protection coding is employed to minimize the effects of reception errors arising through disturbances during the transmission, and thus protect the data. In this, there are two different error protection mechanisms. While only errors can be recognized in the error recognition, with the error correction or a forward error correction (FEC) it is possible to eliminate reception errors without additionally re-transmitting the data.

It is disadvantageous in both mechanisms that they always require additional bandwidth to transmit the redundant information for error detection or error correction. For a channel of fixed bandwidth, the available useful data rate reduces correspondingly.

Furthermore, it could be seen that burst errors also have an especially serious effect in digital transmission systems, apart from the single errors occurring frequently.

Considering real mobile reception, the probability of burst errors still increases. With bad reception, through shadowing of the signal by buildings, mountains, or vegetation, or when driving through a tunnel, several digital data groups (blocks of several bytes) may be lost consecutively.

By the error correction algorithms, which are being standardized in the digital radio broadcasting standard DAB (digital audio broadcasting), of the lower transport layers (for example the OSI layer DataLink), single bit errors within a digital data group or MSC (main service channel) data group may be eliminated, whereas longer-lasting reception errors in temporally successive MSC data groups (developed by the shadowing, for example) cannot be corrected with the same. For this reason, in the provision of error protection for the DAB-used MOT (multimedia object transfer) protocol, particularly the burst errors should be taken into account.

Since in FEC algorithms only a certain number of symbol errors can be corrected per code word, it may happen, when several transmission errors occur consecutively, that too many symbols within a code word are disturbed, and reconstruction of the entire code word is impossible. Such a problem may for example be eliminated by the use of an interleaver, as described in greater detail in the publication "Realization of Optimum Interleavers" by John L. Ramsey (IEEE Transactions on Information Theory, vol. IT-16, no. 3, May 1970).

Using an interleaver, the symbols are then no longer taken from the data stream successively for the formation of a code word, but symbols at the interval of the respective interleaving distance are combined into a code word. From this message code word, redundancy symbols necessary for error protection coding may then be formed in a further step. With this technique, the effects of a burst error, i.e. the disturbance of several successive symbols, are minimized. In FIGS. 10A and 10B, the functionality of such an interleaver is illustrated in greater detail on the basis of a formation of a redundancy symbol from a message word of five symbols length at a reconstruction capability of one lost symbol per code word. The case illustrated in FIG. 10A corresponds to the formation of the redundancy symbols from successive code symbols without interleaving. The striped region here represents a burst error destroying two code symbols each of successive code words. With the reconstruction capability assumed here, the two destroyed code words cannot be restored here anymore on the reception side in spite of error correction mechanisms, because two symbols each have been destroyed in both, but only one could be corrected.

In contrast, the case illustrated in FIG. 10B exemplifies the occurrence of the same burst error, but here using the technique of interleaving in code word formation. The individual symbols of a code word no longer correspond to successive symbols in the data stream. By virtual re-sorting of the symbols, symbols at the interval of the interleaving distance are chosen for the formation of a code word and thus for the generation of a redundancy symbol. The occurring burst error destroys a maximum of one code symbol each in four different code words in this example. These can be restored with the aid of the redundancy symbols and the error protection algorithm used on the reception side.

The forward error correction (FEC) is disadvantageous in that additional bandwidth is always necessary to be able to transmit the redundant information for error detection and/or error correction. For a channel of fixed bandwidth, the available useful data rate therefore reduces correspondingly. With reference to the interleaver, it is to be noted that also a certain latency of the transmission always is to be taken into account in the receiver by the re-sorting of the data, which may lead to a great delay not accepted by users for streaming applications, such as video, for example.

As already mentioned above, forward error correction (FEC) data typically protect a fixed number of bytes. This is done so as to be able to easily discriminate the useful data from the FEC data. The known fixed number of useful data is sent out, then the FEC data should come, then again useful data, and so on. It is important to point to the fact that the forward error correction is employed if a disturbance of the data has to be reckoned with. This simple FEC approach also enables to still differentiate between useful data and FEC data in the case of much data being disturbed.

If data is transmitted using several protocol layers, the data is combined into data groups on the higher protocol layers, and these data groups are transmitted in bit-wise or byte-wise manner on lower protocol layers. On the data group level (i.e.

for example in the higher OSI (open system interconnection) protocol layers), most of the time no disturbed data occurs. If a transmission error has disturbed a byte in a lower protocol layer (and the error protection cannot correct this on this protocol level below the data groups), this will lead to the complete data group being discarded for example due to a CRC error this disturbed byte contained. On the data group level, no disturbed data groups occur, but complete (relatively long) data blocks may be missing.

Thus, on the data group level, it is necessary to recognize and correct the loss of one or more data groups. It is a problem here that the length of data groups in the different transfer protocols may be variable, i.e. it is no longer as easy to generate the FEC data after a fixed number of bytes or apply it on the reception side. Moreover, not only the loss of a series of data groups should be recognized on the reception side, but it should be exactly determinable which data groups have been lost in which length in a transmission. It should then be possible to reconstruct as many of these lost data groups as possible.

Furthermore, it is to be noted that the data rate on the data group level is variable, and several data service applications typically share a transmission channel. In other words, this means that an approach in which a fixed number of data is taken from the channel as useful data and/or as FEC data is not applicable here. The forward error correction algorithm does not "see" all the data on the reception side, but only that undoubtedly received for a certain data service (since for example with correct checksums in subordinate transfer protocol layers).

SUMMARY OF THE INVENTION

Starting from this prior art, the present invention is based on the object to provide a way of improving the error correction at transmission errors that have occurred.

In accordance with a first aspect, the present invention provides transmitter for transmitting information data present in a plurality of data sets, having: an assigner for assigning offset information to one or more data sets of the plurality of data sets, the offset information indicating where a corresponding data set is to be written in a memory of a receiver; a determinator for determining error correction data for the correction of a transmission error in one of the plurality of data sets, wherein the determinator is formed to re-sort the information data of the data sets according to a re-sorting rule, in order to determine the error correction data from the re-sorted information data; a transmitting unit for transmitting the plurality of data sets and the offset information associated with the corresponding data sets, wherein the transmitting unit is formed to transmit the information data in non-re-sorted manner; and a sending unit for sending out the error correction data.

In accordance with a second aspect, the present invention provides method of transmitting information data present in a plurality of data sets, with the steps of: assigning offset information to one or more data sets of the plurality of data sets, the offset information indicating where a corresponding data set is to be written in a memory of a receiver; and determining error correction data for the correction of a transmission error in one of the plurality of data sets, wherein the determining is done such that the information data of the data sets is re-sorted according to a re-sorting rule, in order to determine the error correction data from the re-sorted information data; transmitting the plurality of data sets and the offset information associated with the corresponding data sets, wherein the transmitting is done such that the information data is transmitted in non-re-sorted manner; and sending out the error correction data.

In accordance with a third aspect, the present invention provides computer program with program code for performing, when the computer program is executed on a computer, a method of transmitting information data present in a plurality of data sets, with the steps of: assigning offset information to one or more data sets of the plurality of data sets, the offset information indicating where a corresponding data set is to be written in a memory of a receiver; and determining error correction data for the correction of a transmission error in one of the plurality of data sets, wherein the determining is done such that the information data of the data sets is re-sorted according to a re-sorting rule, in order to determine the error correction data from the re-sorted information data; transmitting the plurality of data sets and the offset information associated with the corresponding data sets, wherein the transmitting is done such that the information data is transmitted in non-re-sorted manner; and sending out the error correction data.

In accordance with a fourth aspect, the present invention provides receiver for receiving information data present in a plurality of data sets, and for receiving offset information associated with a data set, the offset information associated with the corresponding data sets indicating where the data set is to be stored in a memory, having: a first receiving unit for receiving the offset information; a second receiving unit for receiving error correction data; the memory; a processor for processing the received information data to detect a transmission error; an inserter for inserting a data set into the memory at the location determined by the offset information assigned to the data set; a corrector for correcting a transmission error in one of the plurality of data sets, wherein the inserter is formed to re-sort the information data of the data sets according to a re-sorting rule, and wherein the corrector is formed to correct the transmission error from the re-sorted information data, using the error correction data; and wherein the receiver is formed, upon detection of a transmission error in the received information data, to re-sort the information data of data sets according to a re-sorting rule by the corrector and to correct the transmission error from the re-sorted information data in the corrector, using the error correction data, and wherein the receiver is formed to process the non-re-sorted information data upon detection of no transmission error.

In accordance with a fifth aspect, the present invention provides method of receiving information data present in a plurality of data sets and for receiving offset information associated with a data set, the offset information associated with the corresponding data sets indicating where the corresponding data set is to be stored in a memory, with the steps of: receiving the offset information; receiving error correction data; processing the received information data to detect a transmission error; inserting a data set into the memory at the location determined by the offset information associated with the data set; correcting a transmission error in one of the plurality of data sets, wherein the correcting includes re-sorting the information data of the data sets according to a re-sorting rule, and wherein the correcting includes correcting the transmission error from the re-sorted information data, using the error correction data; and wherein the method includes, upon detection of a transmission error in the received information data, re-sorting the information data of data sets according to a re-sorting rule and correcting the transmission error from the re-sorted information data, using the error correction data, and wherein the method processes the non-re-sorted information data upon detection of no transmission error.

In accordance with a sixth aspect, the present invention provides computer program with program code for performing, when the computer program is executed on a computer, a method of receiving information data present in a plurality of data sets and for receiving offset information associated with a data set, the offset information associated with the corresponding data sets indicating where the corresponding data set is to be stored in a memory, with the steps of: receiving the offset information; receiving error correction data; processing the received information data to detect a transmission error; inserting a data set into the memory at the location determined by the offset information associated with the data set; correcting a transmission error in one of the plurality of data sets, wherein the correcting includes re-sorting the information data of the data sets according to a re-sorting rule, and wherein the correcting includes correcting the transmission error from the re-sorted information data, using the error correction data; and wherein the method includes, upon detection of a transmission error in the received information data, re-sorting the information data of data sets according to a re-sorting rule and correcting the transmission error from the re-sorted information data, using the error correction data, and wherein the method processes the non-re-sorted information data upon detection of no transmission error.

The present invention provides a transmitter for transmitting information data present in a plurality of data sets, comprising:

a means for assigning offset information to one or more data sets of the plurality of data sets, the offset information indicating where the data set is to be written in a memory means of a receiver; and a means for transmitting the plurality of data sets and the information associated with the data set.

Furthermore, the present invention provides a method of transmitting information data present in a plurality of data sets, comprising the steps of:

assigning offset information to one or more data sets of the plurality of data sets, the offset information indicating where the data set is to be written in a memory means of a receiver; and transmitting the plurality of data sets and the information associated with the data set.

Moreover, the present invention provides a receiver for receiving information data present in a plurality of data sets and for receiving offset information associated with a data set, the offset information associated with the data set indicating where the data set is to be stored in a memory means, comprising:

a means for receiving the offset information;

the memory means; and a means for inserting a data set into the memory means at the location determined by the offset information assigned to the data set.

Furthermore, the present invention provides a method of receiving information data present in a plurality of data sets and for receiving offset information associated with a data set, the offset information associated with the data set indicating where the data set is to be stored in a memory means, comprising the steps of:

receiving the offset information; and inserting a data set into the memory means at the location determined by the offset information assigned to the data set.

The present invention is based on the finding that a possibility for error protection that is improved as opposed to the prior art is to be provided by providing individual data sets or data groups with additional information so that, after the transmission via a transmission channel, the same can be sorted into a memory again at the right location in a receiver, no matter how many data groups have been transmitted in faulty manner and/or lost completely before. To this end, offset information indicating where the corresponding data set is to be written in a memory means of a receiver is assigned to a data set from a plurality of data sets. Then, one or more data sets and the offset information associated with the corresponding data set are sent out.

In the receiver, then a plurality of data sets and offset information associated with a data set may be received, wherein by knowing the offset information associated with the data set there is a possibility to insert the corresponding data set at a certain location in a memory. Thus, it can be seen that one data set or several data sets have been lost in the transmission or are errored.

By such a procedure, there is the advantage of recognizing lack or wrong entry of data sets in the memory when using a forward error correction, and being able to perform an error correction, taking data correctly entered in the memory into account. Furthermore, when transmitting the offset information assigned to a data set, there is the possibility that standardized and available receivers might be used further, and new receivers, which for example have a possibility for recognition of such offset information, may benefit from the improved possibility of the forward error correction.

BRIEF DESCRIPTION OF THE DRAWINGS

These and other objects and features of the present invention will become clear from the following description taken in conjunction with the accompanying drawings, in which:

FIG. 3 is an illustration of the use of a memory in a further embodiment of the present invention;

DESCRIPTION OF THE PREFERRED EMBODIMENTS

Figure 1A:
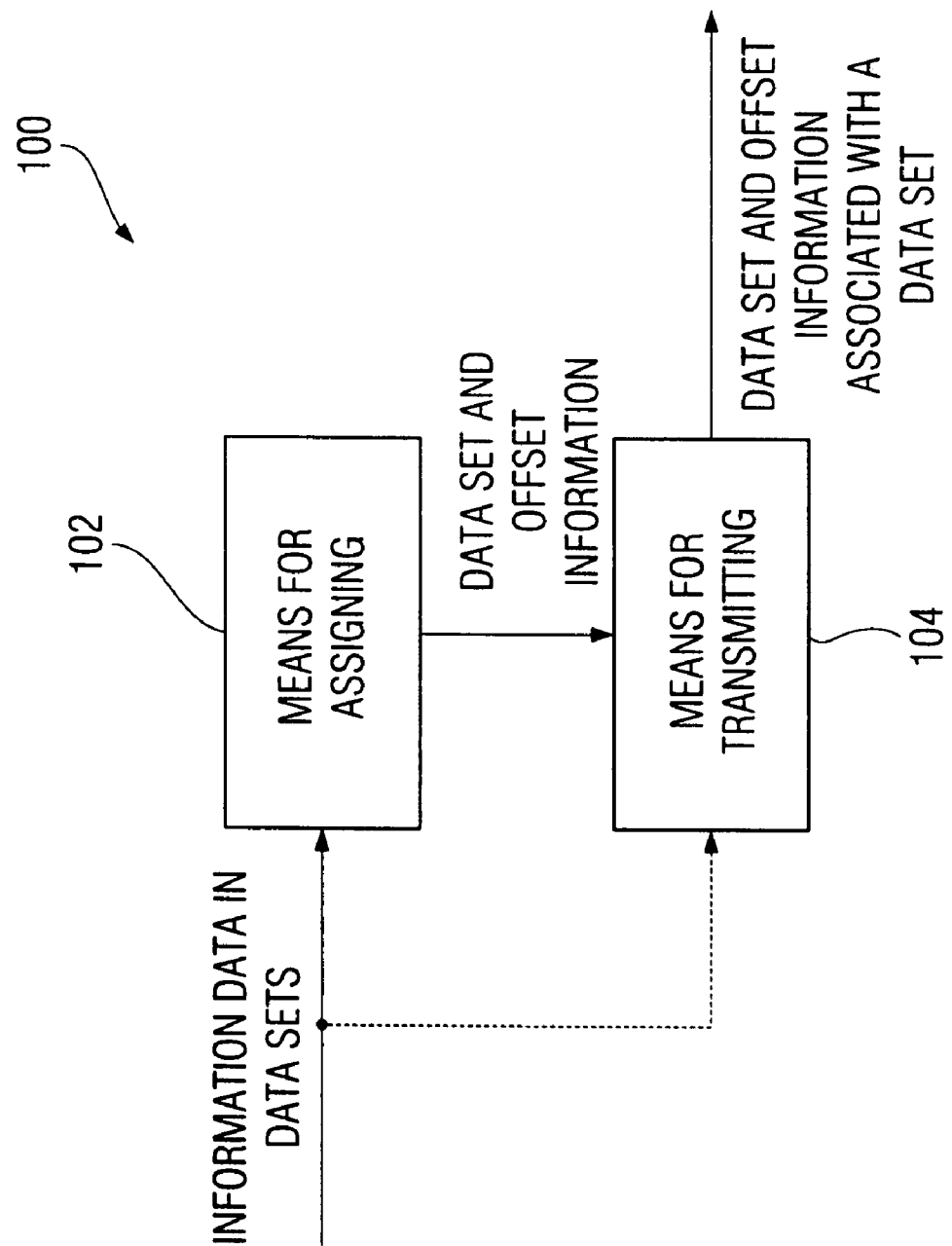
FIG. 1A is a block circuit diagram of an embodiment of a transmitter according to the invention.

In the following drawings, the same or like elements are provided with the same or like reference numerals, wherein repeated description of these elements will be omitted.

FIG. 1 shows a transmitter 100 for transmitting information data present in a plurality of data sets. Here, the transmitter 100 comprises a means 102 for assigning offset information to a data set of the plurality of data sets, the offset information indicating where the data set is to be written in a memory means of a receiver. To this end, the means 102 for assigning comprises an input for receiving information data in the form of data sets. Furthermore, the means 102 for assigning comprises an output for outputting a data set and/or outputting the offset information to the data set. This offset information may for example be information on continuous numbering of the data set, information on the size of the data set, or particularly also information about an offset, which is considered when the data set is to be stored in a memory of the receiver. Furthermore, the transmitter 100 comprises a means for transmitting 104, which is formed to transmit the plurality of data sets and the offset information associated with the data set. To this end, the means 104 for transmitting comprises an input for receiving the offset information and/or the corresponding data set output from the means 102 for assigning. Furthermore, the means 104 for transmitting comprises an output for outputting (or transmitting) the data sets and the offset information assigned to a data set. Optionally, the means 104 for transmitting may also comprise a further input for receiving the information data in the form of data sets to which no offset information is assigned.

If information data in the form of data sets are fed to the means for assigning 102, the means for assigning may for example assign, by the virtual reproduction of a virtually reproduced memory present in the receiver, that offset information indicating at which location the data set is to be entered into the memory present or reproduced in the receiver to a data set. To this end, for example, the means 102 for assigning may fill the data sets with the information data into the memory or the reproduced memory chronologically and then output those memory addresses at which a data set boundary between two data sets occurs as offset information for the next following data set. Furthermore, the offset information may additionally also contain information on the length of a data set, so that for example at a loss of the offset information a potential offset position of the subsequent data set can be calculated back even from the information on the length of the data set. Such a design of the means 102 for assigning then increases robustness against disturbances occurring in the transmission. Furthermore, numbering the data sets through may also take place in the means 102 for assigning, wherein it then becomes obvious, from a simple read operation of this through-numbering marking, how many data blocks or data sets could not be transmitted correctly. But it is to be noted here that information on the length of the data sets or the offset position then cannot be deduced from the number of a lost data set alone.

Furthermore, the offset information may also contain several offset values if the memory is a multi-dimensional memory with a dimension greater than two.

If the data set and/or the offset information to the corresponding data set is output to the means 104 for transmitting from the means 102 for assigning, it may for example embed the data set and the offset information in a data stream of several data sets and then send out this data stream.

Furthermore, the means 104 for transmitting may also directly obtain data sets with information data and embed these data sets together with the one data set assigned to offset information in the data stream. Hereby, it is possible to enter individual data sets at a corresponding location into a memory in the receiver by the offset information assigned to the corresponding data sets, while at the same time other data sets not containing assigned offset information are not entered into the memory. When using such a memory in the receiver for error correction purposes, scaling the error correction for the different data sets may take place. This means that, by the entry into the memory, individual data sets to which offset information has been assigned can be protected in better way than other data sets to which no offset information was assigned and that therefore also are not entered into the memory.

In a further embodiment, the transmitter may also comprise a means for determining error correction data for the correction of a transmission error in one of the plurality of data sets, wherein the means for determining may be formed to re-sort the information data of data sets according to a re-sorting rule and to determine the error correction data from the re-sorted information data. Furthermore, a transmitter according to this embodiment may include a means for sending out the error correction data. Such a transmitter thus allows for improvement of the error correction properties, because now error correction data, which can also be used for error correction, can be determined and sent out. This enables a correspondingly formed receiver to perform an error correction that is clearly better as compared to the prior art.

According to a further embodiment of the present invention, the means for determining may be formed to carry out the re-sorting according to the re-sorting rule such that the information data is read into a memory means according to a writing rule, and the information data stored in the memory means is read out according to a reading rule, wherein the writing rule is different from the reading rule. A transmitter formed in such a manner has the advantage that the re-sorting rule may be executed by simple read-in and read-out operations in a memory and does not have to be performed by a conversion rule, which is intensive to implement numerically or in terms of circuit technology. Such re-sorting may for example take place by an interleaver known to the skilled person, wherein the writing rule for example consists in writing the information data in a matrix-shaped interleaver block (as memory means) row by row and reading out the information data stored in the interleaver column by column.

In a further embodiment of the inventive transmitter, the memory means may include a plurality of memory cells arranged in a plurality of memory rows and a plurality of memory columns, wherein the means for determining may be formed to re-sort information data of a first data set of the plurality of data sets using a first number of memory cells, and to re-sort information data of a second data set of the plurality of data sets using a second number of memory cells, wherein the first number of memory cells may be different from the second number of memory cells. A transmitter formed in such a manner offers the possibility to dynamically redesign the memory region during the operation of the transmitter, in order to make an adaptation to various data set sizes, for example. Taking overhead information for a data set into account, this allows for optimization of the data throughput by optimization of the memory size or the data set size in relation to the overhead information for a data set.

Preferably, in a further embodiment of the inventive transmitter, the memory means may comprise a plurality of partial memories, wherein a number of memory columns or a number of memory rows of the memory means or of the partial memory may depend on a number of information data in a data set. Such a design of the memory again offers the advantage of further optimization of the ratio between data set size and the overhead information to be attached to the data set for signaling purposes. Particularly by the use of several partial memories, which for example have different sizes (i.e. a different number of memory rows or memory columns, it thus is possible to be able to use partial memories of different sizes for the various data sets in the case of channels with variable data rate (for example in the transmission with data sets of different sizes) and thus optimize the data throughput rate in relation to the overhead amount.

It is also favorable if, in a further embodiment of the inventive transmitter, a number of memory columns of the memory means or of a partial memory at least corresponds to the number of information data of that data set having the greatest number of information data. Hereby, it is advantageously ensured that a data set cannot be longer than a row of the memory and a disturbed or absent data set thus only concerns one symbol each per memory column when reading out the memory column by column. If the length of the memory row is too small, a data set would otherwise be written into the first row and half of the second row, wherein lack of the information of the data set filed in the memory then leads to the fact that two information symbols are missing in the first column, which may reduce the correction capability when using an error-correcting code and depending on its current configuration.

In a preferred embodiment of the inventive transmitter, the means for determining may be formed to write the information data of a data set into no more than one partial block. This offers the advantage that an optimization or reduction of the management information providing an indication on the data sets stored in the partial block arises. If a data set is written across several partial blocks, an indication of the presence of data of this partial block is to be filed in every partial block in which part of the data set is contained, so that the content lists of the partial blocks concerned possibly expand unnecessarily and the overhead information is increased unnecessarily. This would again lead to a reduction of the data throughput rate, since an increase in the overhead leads to a reduction in the useful data rate at constant channel capacity.

Furthermore, in one embodiment of the inventive transmitter, the means for determining may be formed to determine the error correction data on the basis of an EXCLUSIVE OR combination or determine the error correction data using a block code algorithm. When using an EXCLUSIVE OR combination to obtain the error correction data, there is the advantage that by this EXCLUSIVE OR combination a possibility for obtaining the error correction data is offered, which is simple to carry out numerically or in terms of circuit technology. But by this EXCLUSIVE OR combination only parity bits or parity symbols can be created, which are capable of correcting a single error in the code words to be monitored. Another case is the use of an (error-correcting) block code algorithm, such as the Reed-Solomon algorithm. Depending on the error correction method used, according to its coding rule, a multiplicity of combinations of useful data and redundancy data proportions can be set, whereby flexible scalability of the error correction properties is enabled.

Furthermore, according to a further embodiment of the present invention, the means for sending out may be formed to send out the offset information. In this case, the means for sending out would be arranged in the means for transmitting and would enable the offset information to be transmitted or sent out in bundled manner with the error correction data. Such a possibility offers the advantage that the transmission of the offset information is possible also in applications with transmission protocols offering no direct possibility for "attaching" the offset information to the original data sets. Here, it is to be noted, however, that in such a possibility buffering the data sets, particularly taking the data set size and the data set position in a data stream to be formed into account, is necessary to be able to evaluate and use the forward error correction information transmitted afterwards, for example.

According to a further embodiment of the present invention, the means for transmitting may be formed to combine the data sets into a data stream and insert the error correction data into the data stream. This offers the advantage that a frame structure for example present for the transmission of information data of the data set in a transmission protocol can be taken advantage of to also transmit the error correction data. In this case, only suitable signaling information would be necessary, for example in a header of the frame used as forward error correction data set.

Furthermore, it also is not necessary to transmit the information data re-sorted for example using the re-sorting rule. These can only be used for the formation of the error correction data, wherein only the determined error correction data can then be transmitted in the data stream. This principle of a "virtual" interleaver thus offers the possibility that not re-sorted information data is transmitted, but only additional information, by the aid of which an improvement of the error correction is possible. This also makes it possible to be able to continue using already present or standardized receivers, but at the same time enables the implementation of an improved error correction possibility in more recent receivers. To this end, it is to be ensured, however, that the error correction data entered in a correspondingly marked frame would have to be discarded or ignored by a conventional receiver, and the conventional receiver thus is not irritated by the transmission of the additional error correction data destined for more recent receives.

Furthermore, in a further embodiment of the present invention, the means for transmitting may be formed to associate the data sets with one or more (e.g. binary) data packets, wherein the means for transmitting may be further formed to integrate the offset information associated with a data set into the data packet associated with the data set. This offers the possibility to communicate information on the offset information associated with a data set already on packet level, whereby more recent receivers are enabled to already enter the data packets or data sets received into a correspondingly constructed memory for error correction. Such a possibility for quick signaling of the presence of offset information to a data set thus offers a possibility of further improvement of the error correction property (particularly the quicker recognizability of the communication of corresponding "auxiliary data") in correspondingly designed receivers.

Furthermore, according to a preferred embodiment, the information data may also be present in a first data set and in a second data set, wherein the means 102 for assigning may be formed to assign offset information to the first data set and not assign offset information to the second data set, and wherein the means 104 for transmitting may further be formed to transmit the first data set and the second data set. This embodiment corresponds to the example illustrated in FIG. 1A, taking the dashed lines into account, which corresponds to the flow of data sets directly into the means 104 for transmitting. Thus, this makes it possible that corresponding offset information is assigned to a data set or some data sets, while no offset information is assigned to another data set. Hereby, the possibility results to fix a scalability of the corresponding error correction capability for individual types of data sets. Those data sets that have been assigned offset information and that may thus be entered into a corresponding memory also in the receiver, hence have a better possibility for corresponding error protection than those data sets that have not been assigned offset information, since these data sets cannot be stored into a memory in the receiver.

According to a further embodiment of the present invention, a first data set may comprise information data of a first topicality and a second data set information data of a second topicality different from the first topicality, wherein the means 102 for assigning may be formed to assign first topicality information to the first data set and assign second topicality information to the second data set, and wherein the means 104 for transmitting may be formed to transmit the first topicality information and the second topicality information. A transmitter formed in such a manner offers the advantage of also transmitting information on the topicality of the data sets sent, whereby it is possible for a correspondingly formed receiver to check also the topicality of the received data sets in the reconstruction, and correspondingly not correct a potentially faulty older data set when receiving a more recent data set, or discard the corresponding correction.

According to a further embodiment of the present invention, the means 104 for transmitting may be formed to transmit a first data set with a first number of information data and a second data set with a second number of information data different from the first number of information data. This enables the use of data sets of different sizes, whereby the field of application of a transmitter formed in such a manner can be extended significantly as opposed to conventional transmitters, particularly to applications working with variable data rate (for example, variable data set size).

Furthermore, in a further embodiment, the means for transmitting may also be formed to transmit information on a memory column number or a memory row number of the memory. A transmitter formed in such a manner enables reconfiguration of a memory size or memory construction to be performed in a correspondingly formed receiver, and thus information on the dimensioning of the corresponding memory to be transmitted via a kind of "auxiliary channel" to the receiver. A transmitter formed in such a manner thus offers the advantage of significant flexibilization and thus also enables significant increase of the field of application.

Figure 1B:
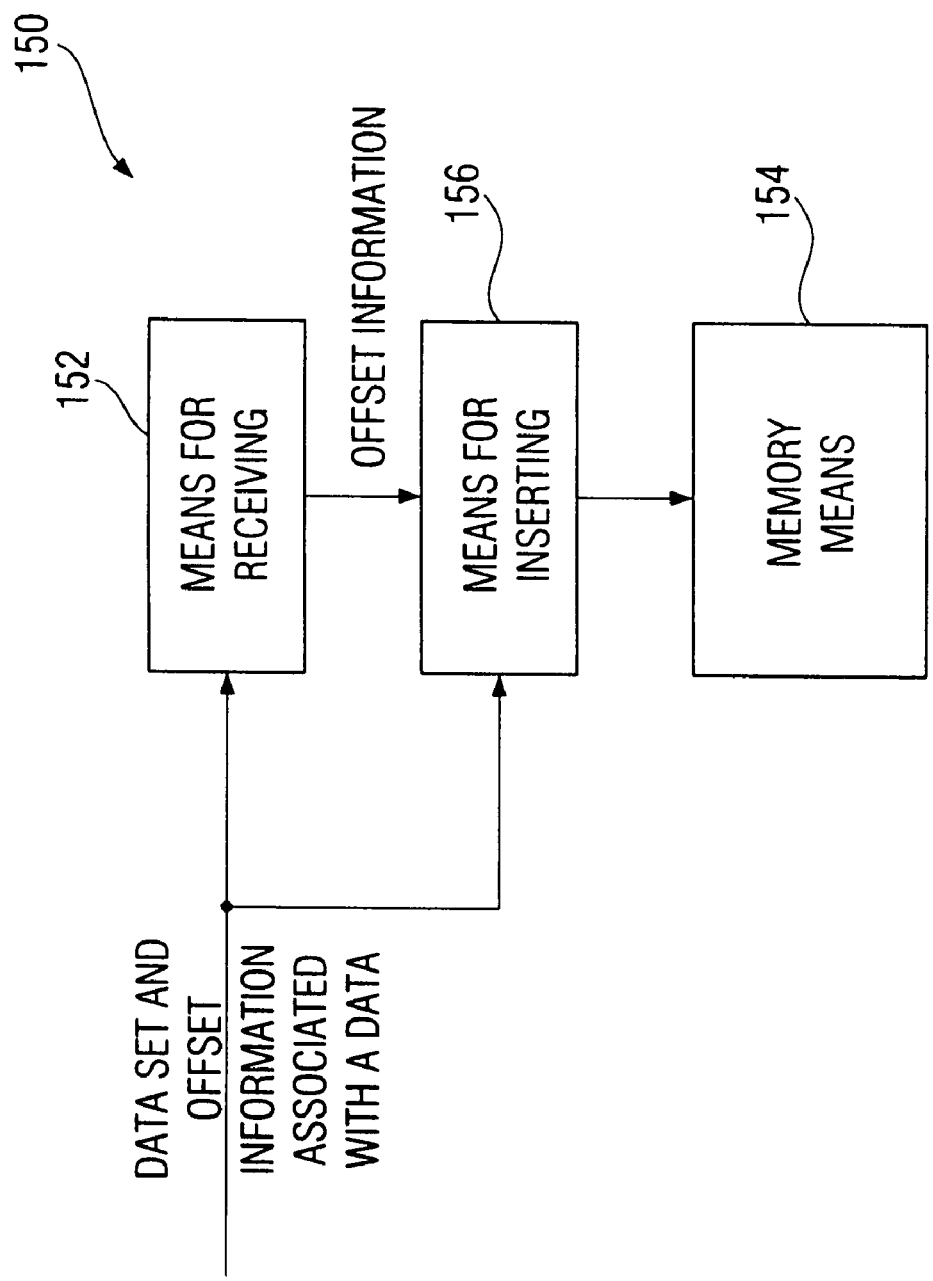
FIG. 1B is a block circuit diagram of an embodiment of a receiver according to the invention.

FIG. 1B shows a receiver 150 for receiving information data present in a plurality of data sets, and for receiving offset information associated with a data set, the offset information associated with a data set indicating where the data set is to be stored in a memory means 154. The receiver 150 here also comprises a means 152 for receiving the offset information, the memory means 154, as well as a means 156 for inserting a data set into the memory means 154 at a location determined by the offset information associated with the data set. The means 152 for receiving comprises an input for receiving a data set of offset information associated with a data set. Furthermore, the means 152 for receiving comprises an output for outputting the offset information. The means 156 for inserting comprises a first input for receiving a data set (or data sets). Furthermore, the means 156 for inserting comprises a second input for receiving the offset information from the means 152 for receiving. The memory means 154 comprises a terminal via which the means 156 for inserting can store a data set at a location determined by the offset information associated with the data set.

If a data set and offset information assigned to a data set are received by the receiver 150, the means 152 for receiving may extract the offset information and make this offset information available to the means 156 for inserting. The means 156 for inserting may now store the data set at the location in the memory means 154 (i.e. the memory) determined by the offset information, from the received data set and the received offset information. Through the knowledge of the offset information, it is possible, for example, to now recognize the loss of individual data sets from a data stream and take the same into account correspondingly when storing the data sets in the memory means 154. This offers a possibility to release corresponding memory segments in the memory means 154, for example when using a forward error correction and thus contribute to a significant increase in effectiveness of communicated error correction data in an error correction.

According to a further embodiment of the inventive receiver, it may comprise a means for receiving error correction data and a means for correcting a transmission error in one of the plurality of data sets, wherein the means for correcting may be formed to re-sort information data of data sets according to a re-sorting rule and be able to correct the transmission error from the re-sorted information data using the error correction data. Such a design of the receiver thus offers the advantage of being able to receive also error correction data in addition to the data sets, whereby an improved possibility for error correction of a transmission error in a data set can be provided, as opposed to conventional receivers.

In a further embodiment of the present invention, the means 156 for inserting may be formed to write the information data of a data set into the memory means 154 according to a writing rule, wherein the means for correcting is further formed to read out the information data stored in the memory means 154 according to a reading rule different from the writing rule. This offers the advantage of a re-sorting rule that is easy to implement numerically and in terms of circuit technology, for example in form of an interleaver. Here, in the design of the memory means 154 in form of a block interleaver, the information data may be written into the block interleaver row by row, wherein the means for correcting reads out the information data stored in the block interleaver column by column and hereby enables re-sorting the information data of the various data sets.

In a further embodiment, the memory means 154 may include a plurality of memory cells arranged in a plurality of memory rows and a plurality of memory columns, wherein the means for correcting includes a means for altering a number of memory cells, and wherein the means for correcting may further be formed to re-sort information data of a first data set of the plurality of data sets using a first number of memory cells, and to re-sort information data of a second data set of the plurality of data sets using a second number of memory cells, wherein the first number of memory cells may be different from the second number of memory cells. This allows for the use of a memory means that is configurable in variable manner. In particular, for example by the adaptation of a number of memory columns, when using a block interleaver (i.e. with a variable length of a memory row of the block interleaver), an adaptation to the size of the data set may take place, whereby the possibility for optimization of the data throughput by optimization of the data processing at variable data set size, and at the same time optimization of the ratio between overhead and useful data proportion of a data set can be performed.

In a further embodiment of the receiver, the memory may comprise a plurality of partial memories, wherein a number of memory columns or a number of memory rows of the memory or of the partial memory may be dependent on a number of information data in a data set. This further enables optimization of the data throughput by adaptation of the memory row number of the memory or of the memory column number of the memory or the partial memory by a possibility for the improvement of the ratio of overhead to useful data proportion in a data set. Furthermore, it is also possible hereby to be able to perform optimization of the data throughput rate by the division of the memory means 154 into various partial memories (taking an adaptation of the size of the partial memories to the data sets of different sizes each into account).

It is also favorable if a number of memory columns of the memory means or a partial memory corresponds to at least the number of information data of that data set having the greatest number of information data. This offers the advantage that, for example when using a block interleaver as memory means, the information data of the data set can be embedded completely into a memory row, and thus improved correction possibility for this data set can be provided, for example, when using an EXCLUSIVE-OR-based forward error correction algorithm.

Furthermore, also the means 156 for inserting may be formed to write the information data of a data set into no more than a partial memory. This offers a further possibility for optimization of the data throughput by an improved possibility to keep the overhead for the transmission of the data set stored in a partial block low.

Furthermore, the means for correcting may be formed to correct the transmission error on the basis of an EXCLUSIVE OR combination or using a block code algorithm. This offers the advantage of being able to perform the error correction on the basis of the forward error correction algorithms, which already exist and thus are examined sufficiently, which offers a significant relief of the implementation of a possibility for the correction of a transmission error.

It is also favorable if the means for receiving error correction data is formed in the means 152 for receiving offset information. In particular, this offers an advantage if, by the use of a transmission protocol not permitting embedding the offset information into the data sets to be transmitted, the error correction information can be transmitted in bundled manner in an error correction data set of its own, and thus the possibility of improving the correction properties of such a receiver can nevertheless be maintained. But this requires an additional buffer, in which the received data sets are buffered and inserted correspondingly in the memory means 154 upon obtaining an error correction data set.

In a further embodiment of the inventive receiver, the means for inserting may be formed to extract the error correction data from a data stream including data sets and error correction data. This offers the advantage of not having to provide a data stream of its own for the transmission of the error correction data, but being able to use that data stream also used for the transmission of the information data of the data sets. To this end, for example, data set configurations may be used, which are freely available in many transmission standards and which may for example be marked correspondingly by a corresponding header signaling.

In a further embodiment, the data sets and the offset information associated with a data set may be embedded in one or more (e.g. binary) data packets, wherein the means for receiving the offset information is formed to extract the offset information associated with a data set from the one data packet or the data packets. This offers the advantage that for example on lower protocol layers, on which data packets are transmitted with the information data of the data sets, the offset information may be embedded and thus be transmitted to the data sets topically. In particular, if freely available transmission capacity is still present in these binary data packets on lower protocol layers, such a possibility offers an advantage with reference to the bandwidth efficiency of already existing systems.

In a further embodiment of the inventive receiver, information data may be present in a first data set and in a second data set, with offset information being associated with the first data set and no offset information being associated with the second set, and wherein the means 156 for inserting is formed to insert the first data set at the location in the memory means 154 determined by the offset information associated with the first data set, and not to insert the second data set into the memory means 154. This offers the advantage of providing a transmission system that can be designed flexibly with reference to the error correction properties of the different data sets. For example, the information data in the first data set, by entering at the determined location in the memory means 154, may be protected in a better way than the information data of the second data set, which is not inserted in the memory means 154.

In a further embodiment of the inventive receiver, information data with first topicality information may be present in a first data set and information data with second topicality information different from the first topicality information in a second data set, the second topicality information indicating higher topicality of the information data of the second data set as opposed to the topicality of the information data of the first data set designated by the first topicality information, and wherein the means for correcting is formed not to correct a transmission error in the first data set and to correct a transmission error in the second data set. This offers the advantage that when using a data carrousel for transmitting the information data, an update of the information data can be recognized, and correction of a data set with out-of-date information data thus does not take place, whereby a disturbance of the overall transmission is avoided.

Furthermore, the receiver may also be formed to receive a first data set with a first number of information data and a second data set with a second number of information data different from the first number of information data. This offers the advantage of the possibility of employment of a receiver designed in such a manner in scenarios with variable data set size and thus also variable transmission rate, or of being able to process variable packet data size and thus of being suited for audio or video applications in especially favorable manner.

It is also favorable if the means for correcting is further formed to receive information on a memory column number or information on a memory row number of the memory means 154 and change the memory means depending on the received memory row number or the received memory column number. A receiver equipped in such a manner offers the possibility of flexibly changing a variation of the size of the memory means 154 or of the construction of the memory means 154, for example using a side channel for the transmission of management information, and thus being able to flexibly react to changing transmission scenarios.

Figure 2A:
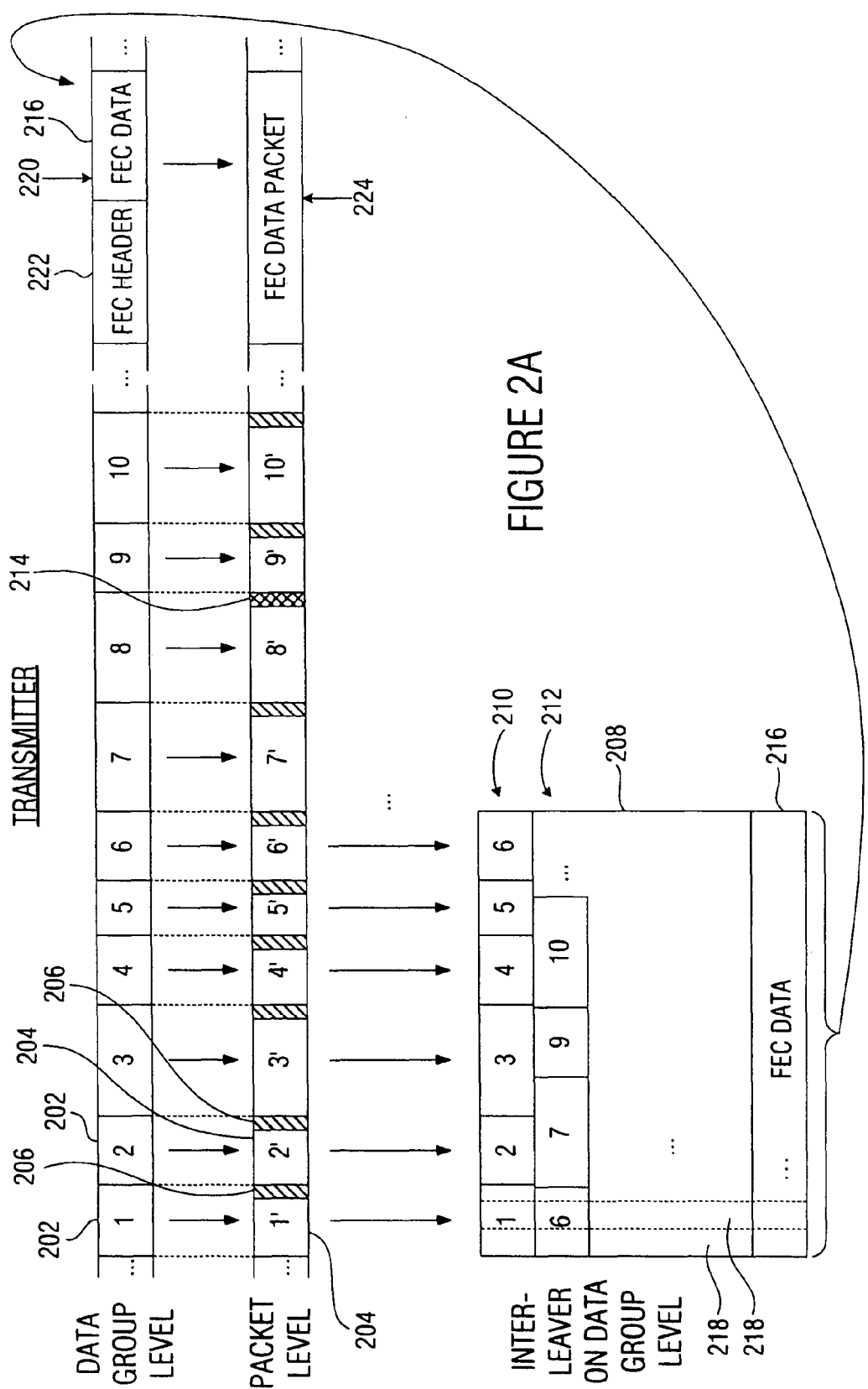
FIG. 2A is a schematic illustration of the functioning of a further embodiment of the transmitter according to the invention.

In FIG. 2A, the course of the data processing is schematically illustrated in one embodiment of the inventive transmitter. Here, the information data is at first present in various data groups 202, wherein the individual data groups 202 are continuously numbered from 1 to 10 on data group level. Here, it is to be noted that the individual data groups 202 may have different lengths. The individual data groups may be transferred on packet level, wherein the packet level may be a lower transmission layer (for example the physical layer or the DataLink layer) in the OSI (OSI=open system interconnection) system model. These data packets may for example be binary data packets or be grouped in bytes. In FIG. 2A, such data packets are designated by the reference numeral 204, wherein the data packets are continuously characterized by the numbers 1' to 10' for better discrimination between the data group level and the packet level. Here, it is to be noted that the data packets 204 have the same lengths as the data groups 204, or may also have different lengths. Furthermore, in FIG. 2A, it is illustrated that the data packets 204 contain an auxiliary area 206, which is not used, for example, in conventional transmission layers for useful data (and is characterized by the binary value "0", for example). This auxiliary area 206 not used for conventional transmission protocols may for example be used, according to the invention, to combine the offset information with the information data of the corresponding data set directly on packet level. Rendered in such a manner, the data packets 204 are then transmitted together with the offset data in the auxiliary area 206 via the means 104 for transmitting illustrated in FIG. 1A. Parallel hereto, the data groups 202 or the information data of the useful data embedded in the data packets 204 may be read into an interleaver 208 row by row in the form of a "virtual" interleaver. As illustrated in FIG. 2A, several data sets or information data of several data sets may thus be read in a memory row of the interleaver 208, which for example corresponds to the memory means 154 in FIG. 1B or has been reproduced therefrom. Here, the length of a memory row of the interleaver 208 may be variable, but should at least be so long that an individual data set does not extend over more than one row. In FIG. 2A, the row length of the first row 210 of the interleaver 208 is chosen such that the first five data sets and part of the sixth data set can be stored therein. In the second row 212 of the interleaver 208, the second part of the sixth data set and the data sets seven, nine and ten are stored then. Here, it is to be noted that the eighth data set in the data group level would for example be much too long for storage in the interleaver 208 and is characterized correspondingly, and no offset information is assigned to this eighth data set. This may then for example be marked in the auxiliary area 206 of the eighth data set 8 or the eighth data packet 8'. For example in the form that this auxiliary area 214 comprises the signaling known from conventional transmission protocols. Hereby, then a correspondingly designed receiver also may recognize that the eighth data set must not be entered in a memory or interleaver and thus subsequent error correction cannot correct errors in the eighth data set 8.

If the individual data sets to be corrected have been entered into the interleaver 208 correspondingly, the FEC data 216 for each column 218 of the interleaver 208 can be calculated for example by reading out the individual columns of the interleaver 208 column by column. These FEC data 216 may then be inserted as a data group of its own in the data group level. For example, a special FEC header 222 may be used here for characterization of this FEC data group with the FEC data 216. Correspondingly, this FEC data group 220 may also be transmitted as a corresponding FEC data packet 224 via the packet level.

Figure 2B:
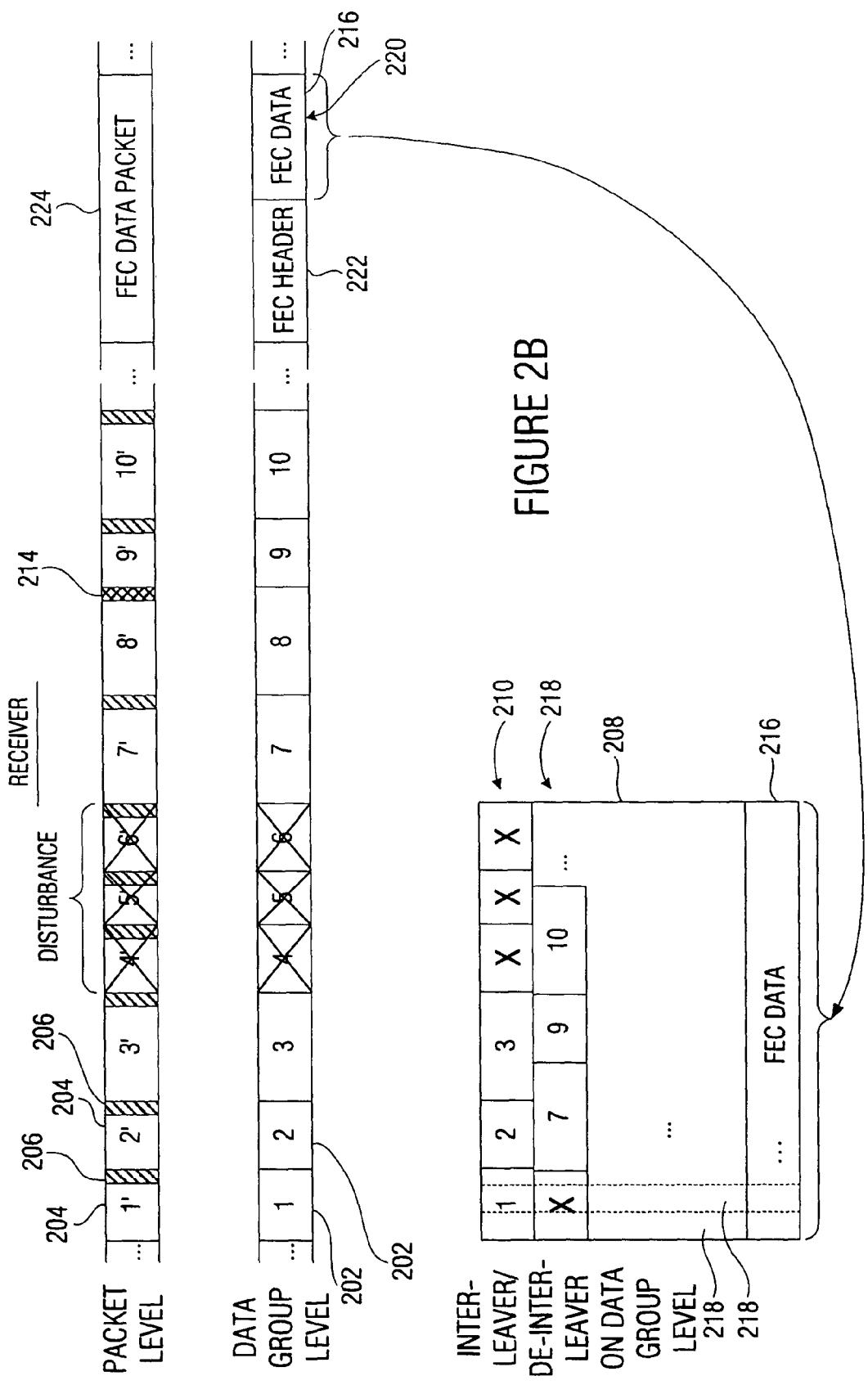
FIG. 2B is a schematic illustration of the functioning of a further embodiment of the receiver according to the invention.

FIG. 2B shows a receiver constructed correspondingly. Here, the data packets 204 with the auxiliary areas 206 are again received on packet level. Corresponding to FIG. 2A, the individual data packets are characterized by 1' to 10' for better discrimination as opposed to the data sets.

If a burst-like disturbance occurs in the transmission of the data packets via a transmission channel, for example, individual bits or bytes in the data packets are changed. This may for example take place by error protection recognition on the basis of a CRC (cyclic redundancy check) method, wherein corresponding CRC data may for example also be transmitted in the auxiliary area 206 of the individual data packets. If a disturbance, particularly a burst-like disturbance, is recognized on packet level by the evaluation of the CRC data, the entire data packet is discarded in many transmission protocols, so as not to pass on faulty data to an application. In FIG. 2B, such a disturbance is exemplarily characterized for the data packets 4', 5' and 6', wherein then, through the discarded data packets 4', 5' and 6', the corresponding data groups 4, 5 and 6 are also discarded on the corresponding data group level.

However, if the receiver comprises a memory means such as the block interleaver 208 illustrated in FIG. 2B, the received data groups or the information data contained in the data groups may, however, be entered in the block interleaver 208 corresponding to a re-sorting rule in parallel to the reception. Preferably, this takes place according to a re-sorting rule, which also corresponds to the "virtual" or "virtually" reproduced interleaver in the transmitter, as illustrated in FIG. 2A. Here, for example, reading in the received data group row by row may take place, wherein offset information transmitted in the auxiliary areas 206 may be evaluated and indicates at which location the received data set is to be entered into the block interleaver 208 corresponding to the offset information. Thus, this enables recognizing missing data sets. For example, if data sets 4, 5 and 6 have been discarded due to faulty data transmission and the error recognition, the data set 7 may be entered at the location in the interleaver block provided for the data set 7. Thus, this enables "releasing" those memory regions into which the discarded data sets would have had to be entered.

By the subsequent reception of the FEC data group 220, the FEC data 216 contained therein may now be used in order to be able to correct individual errors in the columns 218 of the block interleaver 208. Here, it can be seen again that the length of an interleaver row should not be shorter than the length of a data group, because a data group would otherwise extend across more than one interleaver row, and reconstruction of the data group would be possible at a loss of such a data group and the correction property of the FEC data of only one symbol per column.

As it can also be seen from FIG. 2B, by a corresponding encoder of the auxiliary area 214 of the eighth data packet 8', it can also be marked that the eighth data set 8 is not to be detected by the error protection and thus not to be entered in the block interleaver 208 (for example because the data set 8 has a size greater than a maximum, for example hardware-induced size of a memory row of the block interleaver 208).

Regarding the design of a block interleaver, such as the block interleaver 208 illustrated in FIGS. 2A and 2B, it can also be stated that is should be subdivided so that its row number corresponds to the number of message symbols in an FEC code word. Such a block interleaver is illustrated in FIG. 3, for example.

The MSC data group (i.e. the data sets) of the data services to be protected is entered in the buffer row by row when buffering. When the buffer is filled (the next MSC data group can no longer be inserted completely), the redundancy symbols are then formed column by column by means of a suitable FEC algorithm. The interleaving resulting by the combination of entering the MSC data groups line by line and reading out column by column for the code word formation has a great interleaving distance of the length of one buffer block row, which has to be longer than the largest MSC data group to be protected (depending on the data service, but limited by the maximum size of the MSC data groups).

Upon the loss of an MSC data group during the transmission, only one symbol each per code word (column) is destroyed in this manner. The lost MSC data group may be reconstructed. Because normally many MSC data groups lie in one buffer row one after the other, burst errors, which would destroy several successive MSC data groups, can also be eliminated with this interleaver construction.

So as to be able to execute the inverse FEC algorithm for reconstructing a lost MSC data group on the reception side, it may be necessary that the correctly received MSC data groups are entered in the reception buffer at the same location as on the transmission side. To this end, the address of the MSC data group in the buffer should be transmitted together with every MSC data group, preferably in form of the above-mentioned offset information.

For simple reconstruction, it is favorable that it can be recognized on the reception side which MSC data groups within the buffer could not be received (due to reception errors). In order to guarantee this, additional information should be transmitted along with the FEC data. This information could be transmitted most efficiently in form of so-called addressing information. Here, the address of each MSC data group of the transmission buffer is broadcast together with the FEC data.

The advantage of a block interleaver, apart from the great interleaving distance, which also allows for correction of burst errors, lies in the simple addressing. The exact address of the individual MSC data groups within the buffer is important for the decoding on the reception side and may be indicated by the offset within the buffer and the length of the MSC data groups in a simple block interleaver.

It is to be noted, however, that the size of the buffer has an effect on the duration between the reconstruction cycles, because the buffer should always be filled completely first, before the formation of the redundant correction information can take place on the transmission side, or the reconstruction of missing MSC data groups can be done on the reception side. On the reception side, this may cause delays and influences the quality impression of the user. But MSC data groups received in error-free manner may be used immediately, only errored (and thus actually lost) MSC data groups are reconstructed with a delay.

Furthermore, the amount of calculated FEC data and addressing data of the MSC data groups in the buffer is to be taken into account. The FEC data often can no longer be transmitted in a single MSC data group, since MSC data groups often have a default maximum size. For this reason, it may be necessary to subdivide the addressing data to several MSC data groups. For a simple reconstruction, each of these FEC data groups should, however, contain all address data of all MSC data groups in the buffer, so that the overhead (data overhead due to signaling information) rises, however.

These aspects of the simple block interleaver with reference to time delay and amount of management information accumulating are eliminated by further development of the present invention according to a further embodiment.

Figure 4:
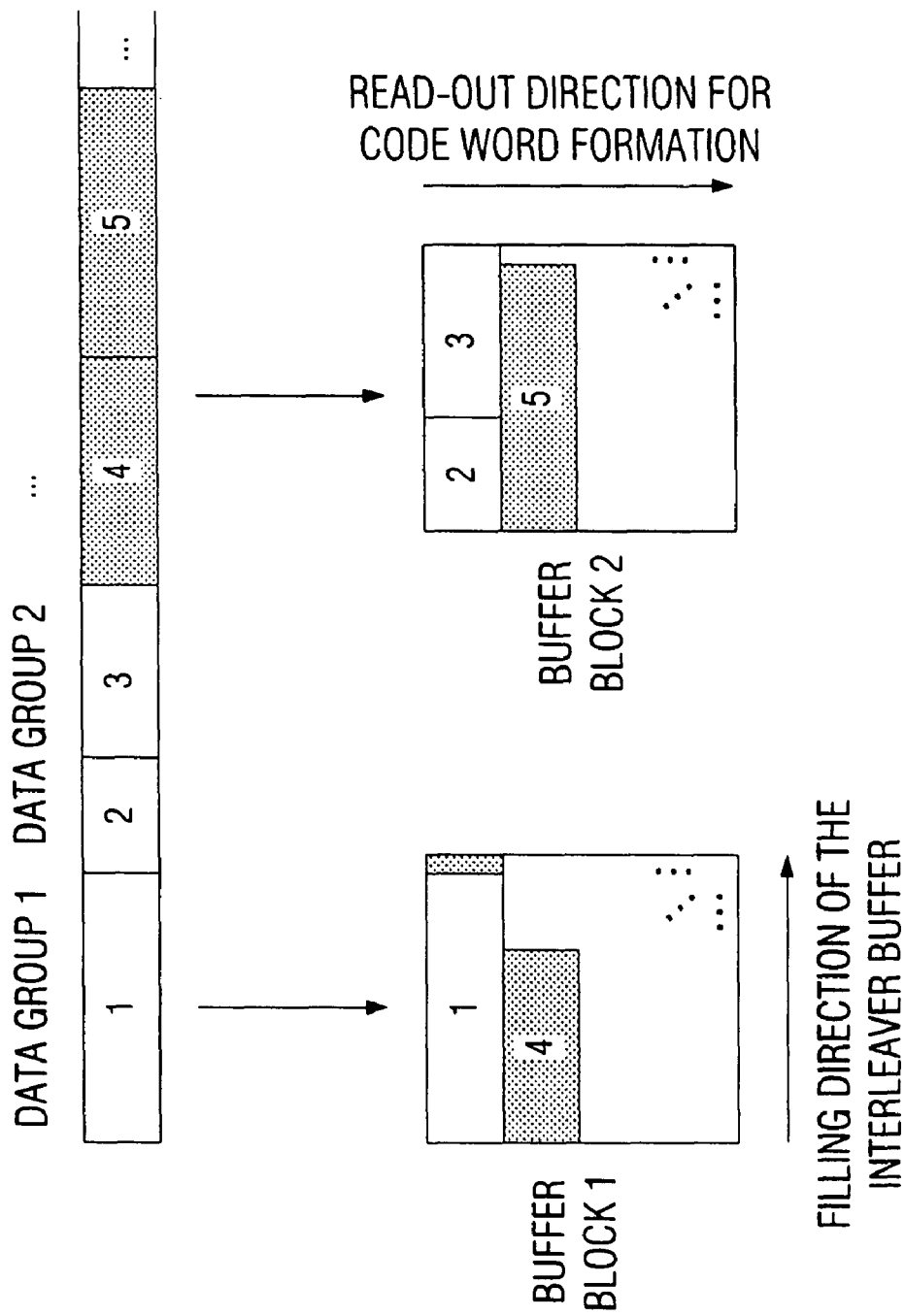
FIG. 4 is an illustration of a use of various partial memories in a further embodiment of the present invention.

In this embodiment, an extended block interleaver is used, in which the memory region used for the FEC calculation is not regarded as contiguous for buffering of the MSC data groups, but divided into several blocks, as exemplarily illustrated in FIG. 4.

The MSC data groups are entered into the individual buffer blocks for the buffering one after the other. Here, one or more successive MSC data blocks are written into the same buffer block line by line for so long that their overall length does not exceed the length of a buffer block row, since otherwise, in the case of burst errors, the maximum interleaving distance would no longer be given. This maximum interleaving distance possible has the value of row length times block number.

Here, reading out for the code word formation and the FEC calculation again takes place orthogonally with respect to the direction of writing in the MSC data groups.

The maximum MSC data group size to be protected is preferably given by the row length. MSC data groups longer than a buffer block row, for example, cannot be entered into the buffer and thus protected from errors. Alternatively, other data groups for example containing low-priority data can be marked so that they are excluded from the FEC error protection. Thus, variable scalability of the error protection can be provided, which enables a corresponding entry into the block interleaver depending on the requirement of the data service for high or low error protection. This offers the additional advantage of free scalability and thus an increase in the flexibility of the employment possibility of a transmitter and/or receiver formed correspondingly.

Since the FEC calculation preferably takes place separately for each buffer block, FEC data is sent more frequently, FEC calculations performed more frequently (but on smaller buffer blocks), and the delay on the reception side until the first possible reconstruction additionally is somewhat reduced. Above all, this results from the fact that the FEC data is inserted into the data stream in more uniform manner.

Three important criteria are to be considered in the decision for one of the two interleaver construction types presented (simple block interleaver or extended or divided one). Firstly, the developed interleaver should enable the correction of burst errors as great as possible on MSC data group level in accordance with the prerequisites presented above. Second, the time delay resulting for the FEC data formation by the buffering of the MSC data groups should be minimized to increase the quality impression of the user. Third, the overhead (overhead by the redundant FEC data and additionally required information, such as the addressing data or offset data) arising through the FEC algorithm should be taken into consideration. Fourth, the size of the FEC data groups to be protected should be taken into account.

Since the interleaving distance (i.e. the maximally possible burst error length to be corrected) is almost equal in both interleaver types at equal overall memory size, the overall memory size for the subsequent exemplary illustration is always chosen at 64 kilobytes.

With this choice, the maximum burst error length to be corrected on MSC data group level lies at 12 MSC data groups if the MSC data group size is assumed at 500 bytes.

For the simple block interleaver (buffer size of 64 kilobytes) as well as for the extended block interleaver (with 10 buffer blocks at 6400 bytes each in the subsequent simulation) two possibilities each have been simulated. On the one hand, a transmission of all additional FEC symbols and management information in a single FEC data group (i.e. a single FEC data set), and on the other hand the transmission in FEC data groups having about the same size as the MSC data groups to be protected. In the simulation, an error protection with an additional, redundant correction symbol per 10 message symbols was assumed, so that the pure FEC overhead was 10%.

Figure 5:
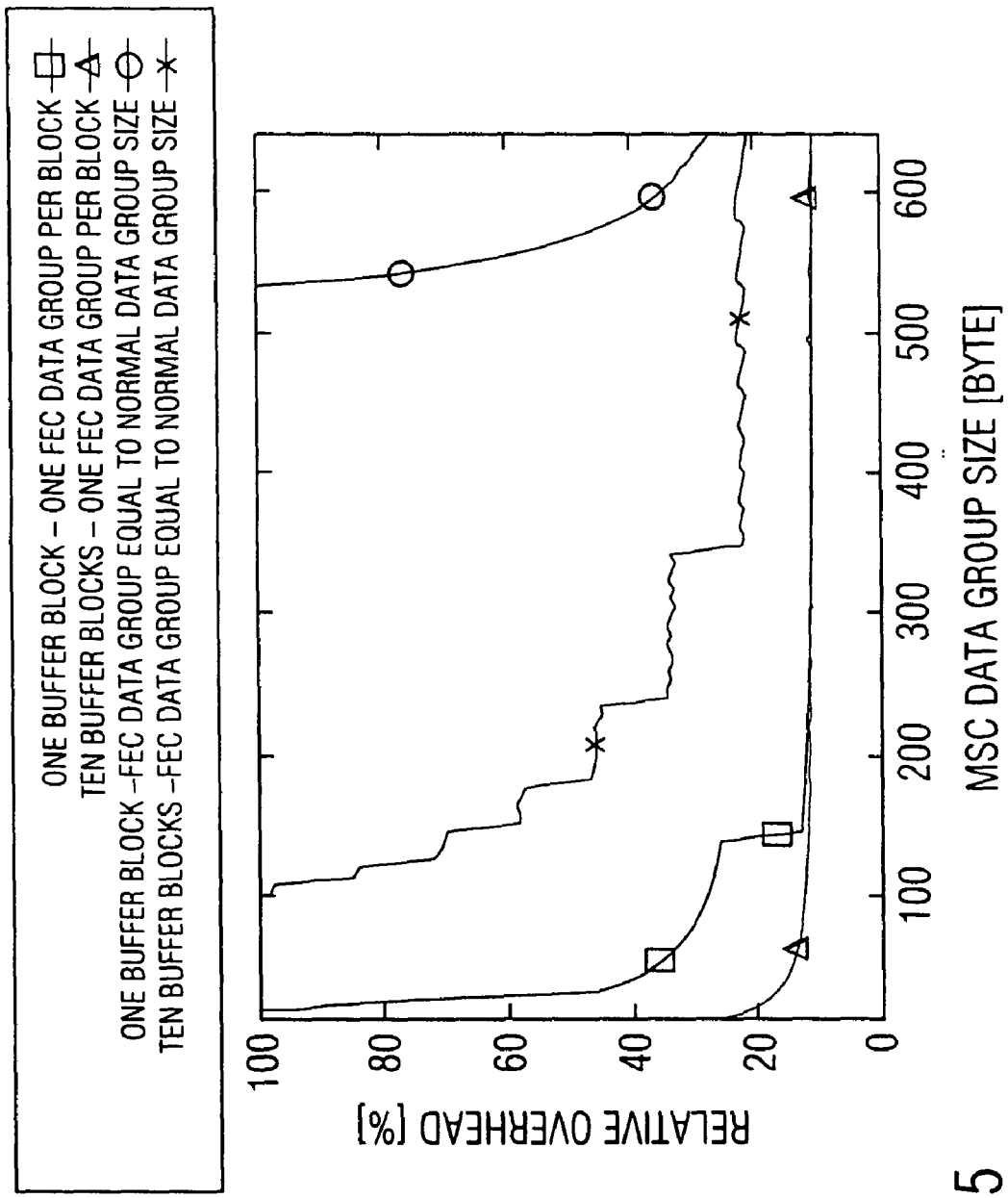
FIG. 5 is an illustration for the exemplary estimation of the relative signaling data overhead when dividing the memory into a different number of partial memories according to various embodiments of the present invention.

FIG. 5 shows the simulation results of the previously described simulation. The relative overhead, i.e. the size of the additionally needed management information (e.g. the addressing information) and the FEC data with reference to the size of the useful data transmitted, is plotted over the size of the MSC data groups to be protected.

It can be clearly seen that with the choice of a simple block interleaver with several FEC data groups (that should all contain the complete addressing data of all MSC data groups contained in the buffer) the overhead is very high in comparison with the other curves, as can be seen from the line characterized in greater detail with a cross in FIG. 5. The same applies for an arrangement of 10 buffer blocks and several FEC data groups per buffer block, the size of which corresponds to the MSC data groups to be protected (see the line illustrated with a cross in FIG. 5).

The chart also shows the aspect that the management information and the FEC data may become too large for an FEC data group. In this case, they would have to be divided up to several MSC data groups. In the chart, the rectangle-characterized line of the simple block interleaver with one FEC data group per buffer block shows this fact in especially clear way. For MSC data group sizes of $\leq 150$ bytes, the addressing information accumulated and the FEC data exceeds the net data group size. A second FEC data group has to be formed, whereby the overhead increases.

At the line belonging to the extended block interleaver with one FEC data group per buffer block (characterized by a triangle in FIG. 5), it can be seen well that the overhead for the management information and the FEC data (when using an FEC algorithm with one correction symbol per ten message symbols) is relatively low and constant at 11%. In a further simulation performed, it could be shown that this value is almost independent of the number of buffer blocks used.

The time gain by this FEC implementation and the thus increased quality of the data service for the user become obvious on the basis of an example:

The data service of a broadcast website with an amount of data of 500 kilobytes is transmitted at a data rate of 16 kbps. A carrousel period of about four minutes ten seconds results therefrom. With errored reception and loss of an MSC data group, without error correction, it has to be waited for the entire cycle time until renewed broadcasting of the same data takes place (if this is not disturbed again). With an FEC implementation and a block interleaver of five parallel blocks at 12800 bytes, reconstruction may, however, already happen after 6.4-32 seconds (depending on in which buffer block the errored MSC data groups are buffered). Thus, the data can be presented to the user in significantly quicker manner.

A further example shows that the buffer geometry (size of the overall buffer memory and number of buffer blocks) should be adapted to the respective data service to be protected by the FEC implementation by the broadcasting provider:

A small data service may for example transmit in 10 MSC data groups and an overall amount of data of 10000 bytes at a data rate of 1000 bps. Therefrom, a cycle time of 80 seconds results. When using a 64-kilobyte interleaver buffer, the maximum time to be waited until the reconstruction is longer than the carrousel period, with more than 524 seconds.

In this case, the selection of a smaller overall buffer memory with few buffer blocks would make sense. In order to obtain a temporal advantage, the buffer size has to be chosen, depending on the data rate, so that the overall buffer is filled within a shorter time than the carrousel period.

In the choice of the buffer geometry, however, it is to be noted that an upper limit for the overall size of the buffer memory should be set. Only in this way is it possible for terminal device manufacturers to produce uniform receivers. The upper limit was set to 64 kilobytes for the simulation.

Depending on the error protection employed, a very large interleaving distance results thereby (e.g. it is 6400 bytes in the formation of an FEC code word out of ten data symbols and one redundancy symbol). In addition, the requirements of integrated reception devices are also taken into account.

As error correction algorithms, for example convolution codes or block codes (also algebraic codes) are available. Convolution codes are suitable for coding continuous data streams and require, in addition to the redundancy, information on past decoding steps for the decoding. Block codes, which can be used for error correction, on the other hand, encode the message in blocks and only need the current message for decoding. For the present invention, the two block codes illustrated briefly in the following have been examined in particular.

The first possibility of a block code is the EXCLUSIVE OR combination (also referred to as XOR coding and characterized by the sign $\oplus$ in the following). This XOR coding is a technique widespread in digital systems. Among other things, it is employed in RAID (redundant array of inexpensive/independent discs) systems for data security in error-tolerant or failsafe systems. A redundant check symbol X is calculated from the message symbols A and B as follows:

$$X = A \oplus B$$

Thus, the two equations $$X \oplus B = A$$

$$A \oplus X = B$$

also apply, with which a message symbol can be reconstructed in the case of errored reception thereof, if it is known which of the symbols is disturbed.

Figure 6:
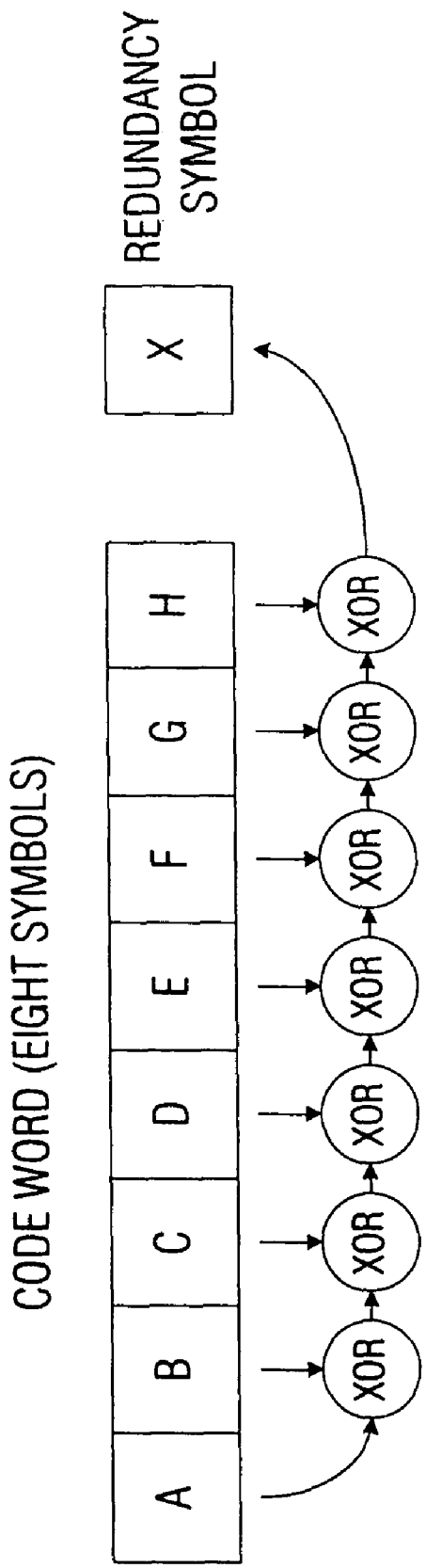
FIG. 6 is an illustration for the formation of redundant additional information according to a forward error correction rule of a further embodiment of the present invention.

These equations also maintain their validity if the redundancy symbol X is calculated from more than two message symbols. FIG. 6 illustrates the formation of the redundancy symbol X of eight information symbols A-H according to $$X = A \oplus B \oplus C \oplus D \oplus E \oplus F \oplus G \oplus H$$

With this method, an individual symbol error can also be corrected in the transmission, independent of the number of message symbols. With this, simple scaling of the overhead (ratio of redundancy symbols to message symbols) can easily be realized and can individually be adapted to the respective transmission channel. A principle problem of the XOR coding, the hardly possible correction of burst errors, may easily be eliminated by interleaving the message symbols. Thereby, the redundancy symbols are no longer acquired from successive message symbols, so that only one symbol each per code word is disturbed in an errored transmission of several symbols one after the other.

A great advantage of the XOR coding is its simplicity; all processors can perform the necessary computation operations quickly and in few clock cycles. Thus, XOR is one of the quickest error protection techniques in digital systems with the lowest power consumption.

A second possibility of the employment of block codes are the Reed-Solomon codes. These Reed-Solomon codes are employed in a multiplicity of application cases in digital communication and storage. They were developed to correct several (also successive) symbol errors.

Here, the encoder forms r redundant symbols from k data symbols at m bits each, so that the code words result in n=k+r symbols length. In contrast to the XOR coding, the decoder, however, can correct t faulty symbols within a code word, even if it is not known which t symbols are disturbed.

For the FEC data transmission, it is to be noted that on the transmission side the individual MSC data groups are written into buffer blocks and thus buffered, while at the same time they are already dispatched, for example. If a buffer block is filled, the redundancy symbols necessary for the error protection are formed with the XOR algorithm, for example.

Transmission of these redundancy symbols that are important for the reconstruction and additional information to the receiver is done in a single MSC data group per buffer block, for example. On the basis of the MSC data group CRC, these data may then be checked for their absence of errors in the decoder.

For correct and unique decoding, the receiver should be imparted with two different information types. The addressing information (i.e. the offset information of a useful data block) describes in which buffer block and to which address within this block the MSC data group was filed, and contains general descriptions of the buffer block. Second, the actual (redundant) FEC data should be transmitted to the receiver.

Figure 7:
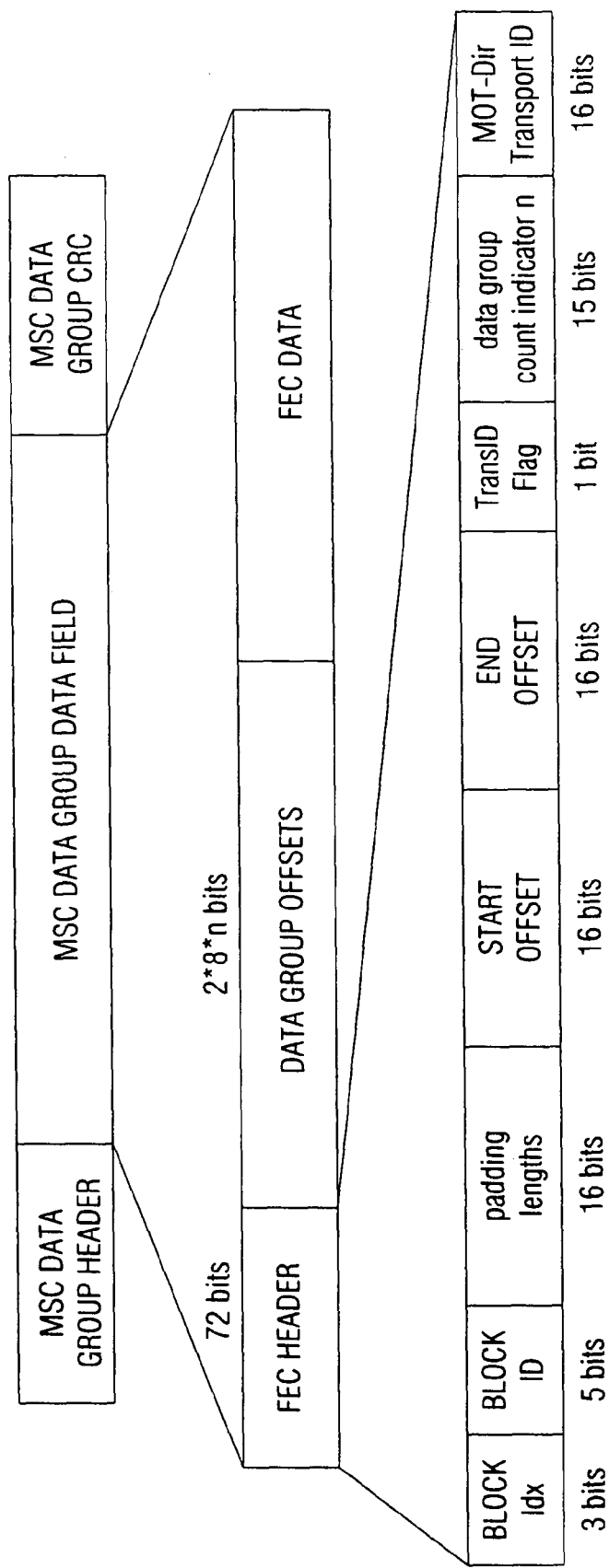
FIG. 7 is an illustration of a special construction of a data set for the transmission of error correction information according to a further embodiment of the present invention.

FIG. 7 shows the construction of the data type developed for the transmission of this information. The header contains general information on the buffer block and the content of the data group. In the FEC data group body, the FEC data and data group addressing information are contained.

Thus, the following information is contained in an FEC data group:

BlockIdx: This parameter of 3 bits length contains a continuous number, which is fixedly linked to a buffer block (i.e. a BlockID) and is incremented whenever this buffer block is sent. It is used to avoid temporal inconsistency of the FEC data upon the loss of an FEC data group. The value of "0" represents a special value and is skipped when incrementing regularly.

BlockID: This unique identification number of 5 bits length designates the buffer block used for the generation of this FEC data group.

padding length: This parameter of 16 bits length indicates the length of a padding area at the end of the buffer block in bytes.

start offset: This parameter of 16 bits length in the FEC header is used to describe the buffer block. It contains the buffer block start in bytes with reference to the beginning of the entire buffer memory region.

end offset: Like start offset, but contains the end of the buffer block with reference to the beginning of the entire buffer memory region. Thus, the following applies:

start offset+buffer block size−1=end offset

Trans-ID-flag: This flag signals whether the MOT-Dir-Transport-ID field is present.

data group count indicator: This dual number of 15 bits length contains the number n of the MSC data groups stored in the buffer block and used for the FEC data formation.

data group offsets field: This field contains n dual numbers of 16 bits length describing the start offsets of the individual MSC data groups of the buffer block. With them, on the reception side, in the FEC decoding, it can be uniquely recognized which MSC data groups could not be received.

MOT-Dir-Transport-ID: This field of 16 bits length contains (if present) the TransportID of the MOT directory valid at the time of sending the FEC data group.

FEC-Data field: This field contains the redundant FEC data.

With reference to additional information of the MSC data groups, it is to be noted that MSC data groups obtained on the reception side should be filed into the same buffer block and at the same address there, in order to be able to perform reconstruction of missing MSC data groups with the inverse FEC algorithm. To this end, additional information is required, which should be transmitted together with the MSC data group.

For exact addressing of the memory location, the block ID and the offset of the MSC data group within the interleaver buffer are required. In order to avoid temporal inconsistency (filing an MSC data group in an out-of-date buffer block) also when buffering the MSC data group in the reception buffer, preferably the parameter BlockIdx of the transmission buffer is also transmitted in addition.

These three parameters can be encoded in 3 bytes. But in part these mostly cannot be transmitted also within the MSC data group (in the user access field of the header or within the MSC data group data field), since in this way the content of the MSC data group would be changed. With this, on the reception side, no longer the same MSC data group would be passed on by the transmission layer, as it was launched on the transmission side. Downward compatibility with receivers without FEC implementation would no longer be guaranteed. Transport of the three parameters in the user access field in the MSC data group header is also not possible due to the data service NewsService Journaline®, because this header field should not be set here. MSC data groups with the user access field set would be discarded by this data service. Thus, existing receivers could not receive any messages when using the error protection.

According to a further embodiment of the present invention, it therefore has been made possible to also send this necessary additional information together with the MSC data group in the padding area of the packet level.

Figure 8:
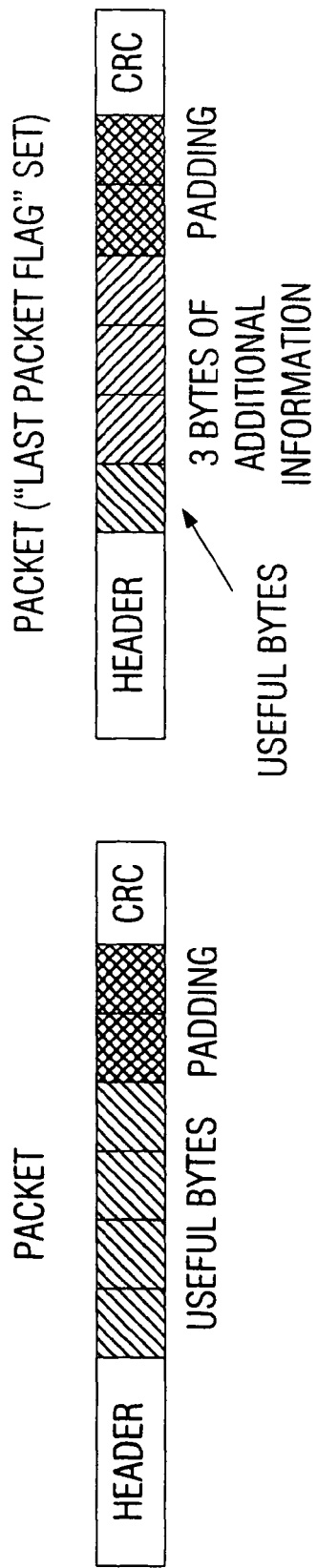
FIG. 8 is an illustration of the distribution of a useful data portion to the padding portion of two data packets according to a further embodiment of the present invention.

Here, it is to be noted that the last packet of an MSC data group is specially set by means of the "last packet flag". If the padding of this last packet is too short for the three bytes required by the additional information, it should be transmitted completely within the next packet. For reasons of downward compatibility, it is often necessary then that there be at least still one useful byte in the same packet. Older receivers could have problems otherwise, if the last packet does not contain any useful data. The useful data proportion therefore might have to be divided up, as it is exemplarily illustrated in FIG. 8. The MOT decoder may simply determine the position of the three bytes of additional information. It is in the packet with the "last packet flag" set directly after the useful data contained.

The standard filling of the padding area is binary zeros. Therefore, the binary value of zero was excluded for the parameter BlockIdx in the specification of the FEC algorithm. With this, padding data can be uniquely discriminated from the three bytes of additional information. A binary zero in all three additional parameters at the same time is to be avoided, if possible, due to the chosen coding.

Moreover, a failure of the error protection may be indicated to the decoder by setting all three values to zero at the same time. With this, it is possible for the broadcast provider, for example, to switch off the error protection at short notice and without special signaling and use the released data rate for the data service.

With reference to a classification of the FEC algorithm, it is to be noted that, when using an interleaver, the data to be protected should be buffered in a buffer before the error protection data can be calculated and sent out. This buffering may also be necessary then on the reception side, and reconstruction of lost MSC data groups may take place after the reception of the FEC data.

In order to obtain the same MSC data group order on the reception side, correctly received MSC data groups also can be processed further in the MOT decoder only after the reception and the application of the FEC data and possible reconstruction of the lost MSC data groups. The advantage of being able to maintain the order of the MSC data groups thus also always causes a latency.

It is also possible, however, to further process, in the MOT decoder, correctly received MSC data groups directly after the buffering in the reception buffer of the FEC decoder, without waiting for the reception of the FEC data and the reconstruction of lost MSC data groups. Since a reconstruction always takes place at a later point in time (after the reception of the FEC data), the order of the FEC data groups may therefore be changed. In the case of error-free reception, however, no increased latency results.

It depends on the transport protocol used and the data service to be protected, whether a change in the order of MSC data groups is possible.

The main focus of this invention is directed to the development of a possibility for an improvement of an error protection for the MOT protocol, i.e. for transmission of self-contained data units, which are, for example, periodically sent out in a data carrousel. In the transmission of data services sent out in such a carrousel, the order in which the received MSC data groups are processed plays a subordinate role. The inventive approach, however, offers the advantage of providing a possibility that no increase in the latency occurs in the error-free case, but a clear time gain as opposed to waiting for the next send-out can be achieved by the error correction in the error case.

But the employment of an error protection method does not only make sense to shorten the reception time necessary. At disturbed reception, it may thereby even become possible in the first place to be able to use a data service in acceptable manner.

So as to be able to use the error correction mechanism described in the embodiment and consisting of an extended block interleaver and an XOR coding for protection of the MOT protocol, inserting additional information into the send-out of the FEC data is necessary, however, in order to enable consistent decoding on the reception side.

Figure 9:
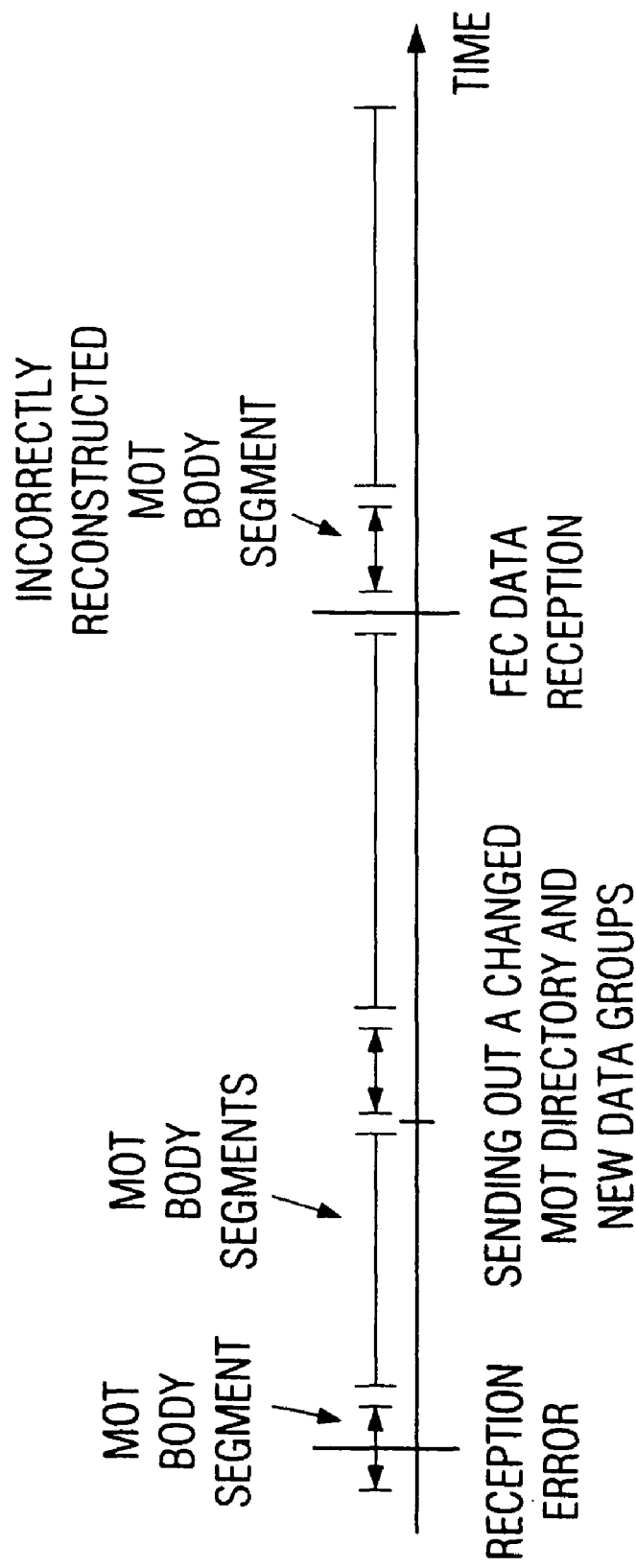
FIG. 9 is an illustration of an incorrectly reconstructed MOT directory.
Figure 10A:
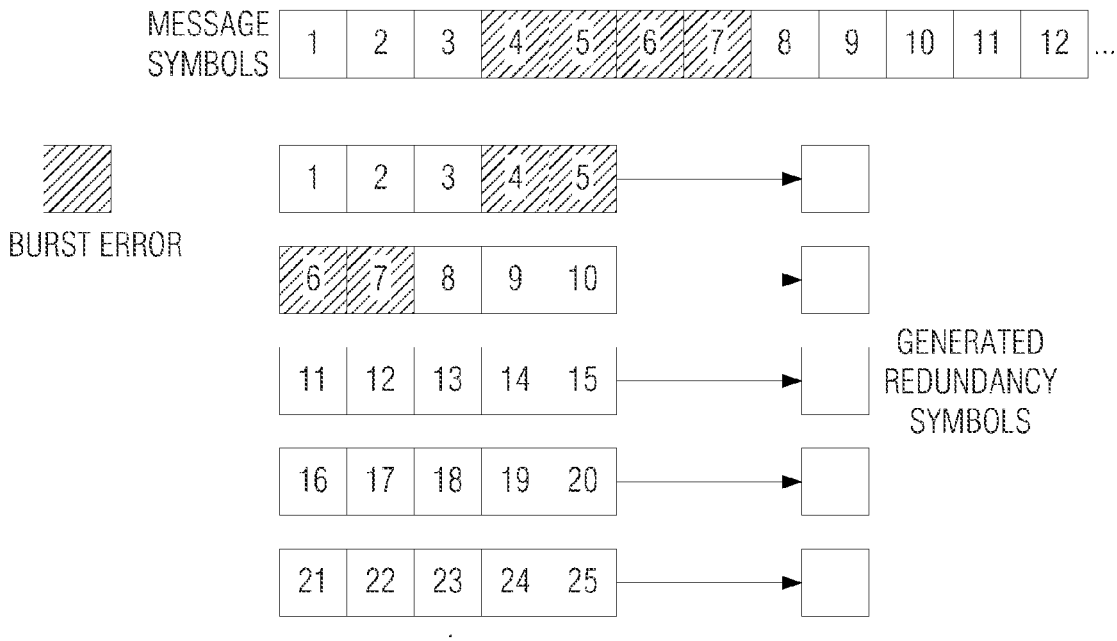
FIG. 10A and FIG. 10B show an illustration of the functioning of a conventional interleaver on the error correction properties when using a forward error correction algorithm.
Figure 10B:
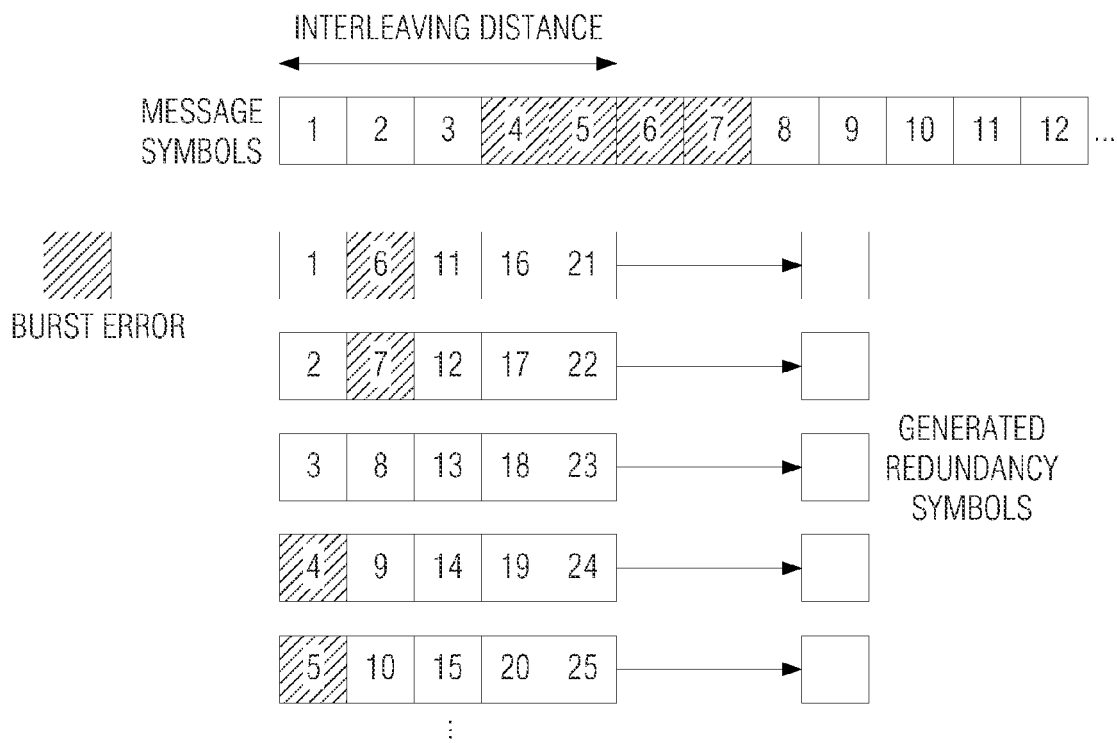

In the transmission in the MOT directory mode, the validity of the "MOT directory" has to be considered, which contains the management information of the currently sent MOT objects. But here, the latency possibly resulting from the reconstruction of an MOT directory segment after performing the FEC algorithm is to be taken into account. At the time of reconstruction, the management information contained should no longer be valid, as it is illustrated in FIG. 9. A new MOT directory, which contains changed management information, may have been transmitted successfully in the meantime. If one segment of an old MOT directory was reconstructed, the decoder would assume that the last MOT directory received is no longer valid. In order to avoid this inconsistency, a unique identification of the MOT directory valid at this point of time, which enables recognition of out-of-date versions on the reception side, also has to be sent at the same time with the redundant FEC information, i.e. together with the FEC data group. To this end, the FEC data group parameter of TransportID can be used. This parameter of 16 bits length uniquely identifies a data object (MOT body, MOT directory, and MOT header) during its transmission. Reconstructed MOT directory segments are only passed on to the MOT decoder if their TransportID corresponds to this parameter.

When using the MOT header mode, a reconstruction of out-of-date MOT units also is to be prevented, because in this mode always only one MOT object is valid at one point in time. In this mode, it is to be noted that the current object may be repeated several times in direct succession. For this reason, it has to be decided from case to case, whether the employment of error protection makes sense. A repetition may increase the error resistance or reduce the overhead as compared with an FEC data transmission. If FEC is employed, the FEC data may for example already be sent, although the FEC buffer is not yet completely filled.

In summary, it is to be noted that by the present invention there is provided a possibility to provide for downward-compatible error protection, for example on data group level, for digital broadcasting systems such as DAB and DRM, which is also applicable to other data-block-oriented transmissions (e.g. the Internet Protocol), in which entire blocks are received in completely correct manner or are completely discarded. The original information is preferably not changed by the FEC. The FEC preferably operates on MSC data group level and can protect all data services using data groups, i.e. blocks of data, which either are received in completely correct manner or are discarded completely. The error correction may be designed in downward compatible fashion, i.e. existing receivers can decode a data service protected with this FEC method, as already done previously. These receivers will ignore the FEC data; hence they also cannot benefit from the enhanced error protection. More recent receivers may for example recognize and evaluate the FEC data and benefit from the enhanced error protection.

The error protection on data group level preferably includes all data services using the transmission protocols MOT (Multimedia Object Transfer), IP (Internet Protocol), TDC (Transparent Data Channel) in the data group mode or proprietary protocols (such as Journaline® does).

Most data services in DAB (Digital Audio Broadcasting) and DRM (Digital Radio Mondial) use data groups and may therefore benefit from this added protection.

The error protection preferably protects individual data services. Usually, several data services can be transmitted in one channel in DAB/DRM. The error protection may individually be activated and parameterized for individual data services.

According to one embodiment of the present invention, the method utilizes a special data group type to distinguish between the FEC data and the data to be protected.

"Classic" FEC methods each protect a fixed, preset number of bytes. On the transmission side, the FEC information is determined for this amount of bytes and also sent in addition to the data. So as to be able to eliminate "burst errors" (i.e. long sequences of errors), the data almost always is re-sorted by an interleaver prior to the FEC coding, i.e. data adjacent in the original data stream is no longer adjacent after the interleaver. Hence, the error protection does not have to be able to correct long error sequences, but many short error sequences. The number of errors does not change by the interleaver, but it is technically simpler to correct many single errors than long burst errors.

An additionally added interleaver does, however, lead to the useful data typically leaving the interleaver in another order.

For the downward compatibility it is especially favorable that the useful data of each data block can be processed exactly in the same order on the reception side as without FEC (especially without the interleaver re-sorting the useful data). Hence, in the previously described approach, preferably a "virtual" interleaver is employed, in which the useful data is indeed "virtually" re-sorted for the determination of the FEC data; but the useful data is still transmitted in its original order. On the reception side, the data is preferably also re-sorted "virtually" before the FEC data is applied as error protection. Potentially corrected data is then again re-sorted correspondingly, before being passed on to the further processing stages on the reception side. The re-sortings do indeed increase the effort, but guarantee the downward compatibility.

In the proposed approach, especially a block interleaver in matrix or rectangular shape may be considered. The useful data is preferably entered line by line (starting in the "upper left corner": at first along the first row). If this is completely filled, entering into the next row is started, and this method is continued to the "lower right corner". Preferably, only data groups completely fitting into the block are entered. If the block is full (a data group was supposed to be inserted, but does no longer completely fit in the block), then the error correction data (the FEC correction data) is determined column by column and transmitted, and the block interleaver is emptied. The new data group that has kicked off calculating the FEC data is then entered into the now empty block (again starting in the left upper corner).

The previously described approach preferably utilizes a "virtual interleaver", as it has been described previously, so that the useful data can be transmitted in unchanged order.

In the previously described approach, preferably, data is added to an interleaver block for so long until it can no longer accommodate the next data group. The rest of the interleaver block is filled with zeros for the determination of the FEC data. Preferably, these zeros are not transmitted, but the FEC decoder is notified of the length of this zero area. In this manner, the complete content of the interleaver block is known to the FEC decoder for the FEC decoding, even if the zeros themselves are not transmitted.

The approach proposed in the present invention preferably marks all data groups so that they can be sorted in at the right location in a virtual interleaver, for example, no matter how many data groups have been lost before.

This marking is preferably done in the padding area of a layer below the data group layer (that is, on packet level). Existing receivers will mostly ignore this data, since the proposed coding is preferably chosen so that it lies in the padding area, which is normally ignored by the receivers.

Preferably, in the FEC decoding, only data groups carrying this additional offset information are taken into account. Hence, it is possible dynamically to exempt individual data groups from the FEC protection, e.g. because they are too large for the chosen FEC parameterization.

The "virtual" interleaver thus preferably allows for the use of a single interleaver block (i.e. all data groups are entered into this interleaver block) or also the use of several interleaver blocks, into which data is written in turn. I.e. instead of a large FEC block, there may be several smaller ones in some cases. This makes it possible to be able to parameterize the size and number of the FEC data blocks (which should indeed be transmitted as one or more data groups). The decision as to which data group is sorted into which block is preferably taken by the FEC encoding side, and it preferably notifies of this in the management information, for example, which is appended to each data group of the useful data.

Just like the useful data, the FEC data preferably also contains management information to be able to exactly determine how many data groups of which length should have been sorted in where in the virtual interleaver. In this manner, for example, it is then known to the FEC system which data group of which length is missing, and it may be determined whether and, if applicable, how this data is to be reconstructed.

The FEC data of an interleaver block may preferably be transmitted in one or more specially characterized data groups. In terms of overhead, for example, it is most favorable if it can be made do with one data group per FEC block.

As already mentioned, one or more interleaver blocks may be used. It is recommended to use so many interleaver blocks that the FEC information generated for the correction of this data still fits in a single data group. The data groups in DAB/DRM allow for a maximum length of 8191 bytes net. Since the probability of reception errors within a data group (one reception error leads to the complete data group being lost) depends on the size of the data group, it makes sense to use significantly smaller data groups. The approach proposed here allows for the parameterization of the data group size of the FEC data.

The data within an interleaver block have previously been protected with XOR. This makes it possible to correct one error per interleaver column. Depending on buffer number and size, this may be one or more (completely lost) data groups. It is important that each data group should preferably be no longer than a row of the interleaver block, because otherwise one missing data group induces two or more errors in one column.

XOR seems to be a good tradeoff between error protection and overhead here (both concerning the data rate for the FEC data and the complexity of the calculation).

Hence, in the present invention, it has been gone into the XOR error protection in depth (which is able to correct one error per column of our interleaver block). Other error protection methods (Reed-Solomon etc.) can also be utilized. Preferably, corresponding insertion of the data sets into the memory should only take place at the transmitter and receiver, i.e. that for example the readout direction in transmitter and receiver is column by column each (from top left down the first column, then the second column, etc.).

As already mentioned above, "classic" interleavers usually "collect" useful data, then calculate the FEC information, and pass the data on only after the complete block including the FEC data is available. This means that the "classic" interleaving always delays the data.

On the reception side, this "classic" procedure may exemplarily be described as follows: At first, all correctly received useful data is entered into the respective interleaver block. Once the FEC data has been received completely for the corresponding interleaver block, potentially missing/corrupted data is reconstructed. The data of an interleaver block is, however, passed on only after ALL of the data has been received. Thus, the data is also always delayed on the receiver side.

The reason for having to wait until the interleaver block is filled in the "classic" interleaver is that by interleaving the data has to be re-sorted, that is, parts of the data to be entered into the block at the end are also sorted to the beginning of the block. Therefore, the data of a block cannot yet be passed on until all data is present and all "gaps" in the data are closed.

In the previously described approach, in this respect, a "virtual" interleaver may be employed, however. This means that the useful data is transmitted in unchanged manner. For this reason, it may also be sent without delay on the transmission side, and a copy be filed in the interleaver block at the same time. If the interleaver block is filled, the FEC data is generated and dispatched. Thus, due to the "virtual" interleaver, a delay of the data does not occur.

On the reception side, it has to be distinguished between two cases. There are applications requiring the useful data in exactly the order in which it has been generated (for example a video, or other streaming applications). Like in the "classic"

interleaver, these applications require a delay; namely by the time it takes to fill the (all!) FEC blocks and reconstruct the lost data groups. Only after all FEC data has been applied and all blocks have been treated, is it known which data groups could be reconstructed and which are irretrievably lost.

Other applications utilize the cyclic transmission of data (e.g. of files). I.e. the data is divided into smaller data blocks and sent. Each data block contains information about which "file" it belongs to and which part of the "file" it contains. A protocol providing such a cyclic transmission is the MOT protocol, which is used in DAB and DRM for the transmission of multimedia data.

In such protocols, the order in which the data is received is unimportant. An application the data of which is transmitted once per quarter hour may naturally benefit strongly when lost data groups can for example be reconstructed after one minute (after the corresponding interleaver block is filled and the FEC data has been received) and the renewed send-out of the data one quarter of an hour later does not have to be waited for.

The delay on the transmission side is unimportant for the user of data services (it does not matter whether the data has been generated 2 seconds or 25 seconds ago). On the reception side, when switching the device on, it makes no big difference whether the first data can be displayed after 10 seconds or only after one minute.

The latency depends on the size of the interleaver. The smaller the memory (i.e. the interleaver), the smaller the latency (and the cheaper of course also the reception device). But the size of the interleaver also determines how many lost data groups are reconstructed. Data groups usually are several kilobytes in size (for example about 8 KB maximum), and an interleaver capable of accommodating several data groups at the same time is required. The previously described approach is based on a recommendation for a maximum size of the interleaver of 64 KB. Corresponding to the data rate of the service, it may take several seconds to minutes until an interleaver block is filled completely (for example about 2 minutes at 4000 bits per second).

In applications with cyclical send-out of the data, the "virtual" interleaving thus offers the possibility of not delaying the useful data and still being able to reconstruct and utilize lost useful data with acceptable delay times.

The MOT protocol describes all data sent at one point in time with special management information (the so-called MOT directory). This management information is also divided into data groups and sent. It should be ensured that in case of a change of this management information (that is, if files are changed, added or removed), a potentially lost and later reconstructed data group of this management information is not passed on to the MOT decoder. The error protection thus should permit to recognize out-of-date management information and prevent its reconstruction and passing on.

The previously described approach preferably also contains, in the FEC data, the information about which version of the management data is valid at the moment (this information is the TransportId, the transport tag marking all data groups of a certain version of the management data). In this manner, it can be ensured that no out-of-date management data is passed on. Through this information, the error protection functions especially well also if the sent data is updated regularly.

Preferably, the present invention relates to the use of a special data group type in DAB and DRM, which transfers the FEC data. The FEC data may be transferred in one or more data groups each.

The use of a "virtual" block interleaver (inserting row by row, error correction column by column) allowing for downward-compatible error protection favors low latency of the interleaver. "Classic" interleavers would of course also be possible, even if no downward compatibility and an increased latency would be "bought" with this. For streaming applications (such as video), the increased latency on the reception side is unavoidable anyway, since reconstructed data groups can be used only if the order of the data groups is not changed. The further following aspects are dependent on which interleaver is used.

The error protection (at least the one with the "virtual" interleaver) preferably does not introduce latency in the error-free case in the processing of the received data. In the error case, reconstructed data might be processed in another order than in the error-free case. For many transmission protocols, however, this is no problem.

The interleaver may manage one or more blocks. The geometry of the blocks is flexible and can be changed at runtime (because signaled).

The division of the useful data groups into the individual blocks may be changeable flexibly and dynamically.

Individual data groups may also be exempted from the FEC by the signaling also on a short-term or longer-term basis (e.g. if the individual data groups are too large, or there is no data rate available for the error protection on a short-term basis).

Additional information for the error protection is transmitted in the padding area of the underlying transport layer (e.g. in the packet mode) in the padding area of the packets (e.g. in the last packet at the end of the data group would make most sense; the employment in the PAD channel of DAB is also possible). This allows for entering the useful data into the respective FEC block. (Also see below, how the additional information can be transmitted in IP (Internet Protocol)-based applications). This additional information could also be transmitted within the useful data (that is, within the data groups), e.g. in the "end user address field".

With transmission methods not providing a possibility to append this additional information to the individual transmission blocks, but with the individual data blocks having a unique tag (e.g. object tag/segment number; unique sequence number; . . . ), this information may also be transmitted in addition (for example as part of the FEC information). But since in this case the information of where a block is to be entered in the interleaver may only be available later, the memory need may be higher (the data blocks have to be buffered first and can be entered into the interleaver only after the reception of this FEC information, because its position in the interleaver is known only then).

The FEC data (as a data group/data groups of its/their own) preferably contains the error correction data to be able to reconstruct lost data (also several successively lost data groups), including the data indicating which lost data groups would have had to be entered where in the interleaver block (if they had been received).

For example, the error correction uses XOR, but other methods, such as Reed-Solomon etc., could also be employed.

The error correction for example indicates the TransportId of the MOT directory valid at the time of the FEC data generation. This ensures that the receiver can recognize and ignore old management information of the MOT protocol. Other transport protocols might use other characterizations for the current version of the management data. It is only important that the principle of the characterization can also be applied to other protocols.

The error protection is also applicable to IP. In this case, the term "data group" would not be used, but it would be referred to "UDP datagrams". For example, the protection would be possible for application cases in which the data is sent "via air" (e.g. via IP multicast/IP broadcast) (for example satellite, UMTS, GPRS, WLAN, or DAB/DRM via IP tunneling, etc.) and also includes cyclically sent data (that is, data carrousel streaming). It could also be applied in media, such as glass fiber or cable.

In pure Internet point-to-point applications (such as email, HTTP, etc.), however, the error protection is not necessary in most cases because TCP/IP offers enough protection for this. But if one source cyclically supplies many users with data (e.g. a news ticker), the protection may make sense.

The previously described approach also applies to all transmission systems offering IP as transport layer (DVB, SkyDSL, etc.).

The additional information, which is preferably appended to the useful data (and for example indicates at which position in which block the data is to be entered), could be filed in the IP header in IP.

The proposed approach is also applicable to other datablock-oriented transmissions in which entire blocks are received correctly or discarded completely. The original information is not changed by the FEC (at least when employing the "virtual" interleaver).

The method still functions with each arbitrary error protection.

For downward-compatible send-out, the original data should, however, not be changed too much for the determination of the error protection. The data could indeed be temporarily re-sorted (interleaving) for the error protection calculation; but the error protection method should only change the original data so far that these changes can be "replicated" with the received original data on the reception side, before the error protection is applied on the reception side, so that the data blocks can be transmitted in completely unchanged manner in the transmission channel.

In the simplest case, the error protection does not change the order of the data it protects. The transmission side then has the FEC data determined via the copy of the data blocks sent; the reception side reconstructs the lost data blocks.

If the error protection uses interleaving and assumes that the data is transmitted as it is made available after the re-sorting by the error protection, the following should be done:

If the data has been sent only through one interleaver (that is, only re-sorted), the same state of the interleaver buffer that also existed on the transmission side should be created on the reception side prior to applying the error protection. This means that in the interleaver, on the transmission side, the data is re-sorted first, and then the error protection is determined. If the data is transmitted in another order as intended by this error protection/interleaver, then at first the data (which is transmitted in its original order and construction) has to be entered into an intermediate buffer on the reception side; but before the error protection can be applied, first of all the interleaving used on the transmission side should be repeated so that the error protection for the following error correction finds the data in the order in which it has determined the error protection on the transmission side.

This means that on the reception side an interleaver should then be used twice. First for reconstructing the interleaver block on the transmission side, and then interleaving "back" again, in order to obtain the reconstructed data in its original order again. If necessary, during "interleaving back" following the error correction, however, only the originally missing/defective data may be extracted directly so that no second complete interleaver buffer is required.

Thus, three aspects result:

a) In the previously described approach (or the error protection method), in which the data is preferably transmitted in a channel of variable data rate, the data blocks and FEC data are marked so that an FEC can be applied. The approach allows for various error protection methods, various interleavers, as well as various buffer sizes and number. If "virtual interleaving" is employed, a downward-compatible send-out may be possible. The "virtual interleaving" does not lead to an increase in latency on the transmission side. Marking the data depends on the transmission protocol.

b) The above-described approach offers a possibility to be able to perform a downward-compatible send-out in DAB and DRM by skillfully marking the data blocks as well as the FEC data and by "virtual interleaving". The "virtual interleaving" does not lead to an increase in latency on the transmission side. Marking the data depends on the transmission protocol; in particular, DAB and DRM are mentioned previously.

The marking in the data blocks preferably takes place in the padding area on packet level or "PAD sub-field" level. Marking the data in the end user address field of the data groups would also be possible. Marking the original data blocks (the downward-compatible addition of additional information) could also be used for other additional information.

c) The previously described approach further offers a possibility of ensuring, by signaling the version state of management information, that the receiver can immediately process the correctly received data further and the data blocks corrected later (after the reception of the FEC data) are preferably processed further only if they are not already out of date (and thus "harmful"). The proposed possibility of how the signaling of the version state of the management information is done depends on the respective transmission protocol used; our solution refers to the MOT protocol for DAB and DRM.

Depending on the conditions, the inventive method of transmitting information data or of receiving information data may be implemented in hardware or in software. The implementation may be on a digital storage medium, in particular a floppy disc or CD, with electronically readable control signals capable of interacting with a programmable computer system so that the corresponding method is executed. In general, the invention thus also consists in a computer program product with program code stored on a machine-readable carrier for performing the inventive method, when the computer program product is executed on a computer. In other words, the invention may thus also be realized as a computer program with program code for performing the method, when the computer program is executed on a computer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A transmitter for transmitting information data present in a plurality of data sets, comprising:

an assigner for assigning offset information to one or more data sets of the plurality of data sets, the offset information indicating where a corresponding data set is to be written in a memory of a receiver;

a determinator for determining error correction data for the correction of a transmission error in one of the plurality of data sets, wherein the determinator is formed to re-sort the information data of the data sets according to a re-sorting rule, in order to determine the error correction data from the re-sorted information data;

a transmitting unit for transmitting the plurality of data sets and the offset information associated with the corresponding data sets, wherein the transmitting unit is formed to transmit the information data in non-re-sorted manner; and a sending unit for sending out the error correction data.

2. The transmitter of claim 1, wherein the determinator is formed to determine the re-sorting according to a re-sorting rule such that the information data is written into a memory according to a writing rule, and the information data read in the memory is read out according to a reading rule, wherein the writing rule differs from the reading rule.

3. The transmitter of claim 2, wherein the memory includes a plurality of memory cells arranged in a plurality of memory rows and a plurality of memory columns, wherein the determinator is formed to re-sort information data of a first data set of the plurality of data sets using a first number of memory cells and re-sort information data of a second data set of the plurality of data sets using a second number of memory cells, wherein the first number of memory cells may be different from the second number of memory cells.

4. The transmitter of claim 2, wherein the memory comprises a plurality of partial memories, wherein a number of memory columns and a number of memory rows of the memory or of the partial memory may be dependent on a number of information data in a data set.

5. The transmitter of claim 4, wherein the number of memory columns of the memory or of a partial memory corresponds to at least the number of information of that data set having the greatest number of information data.

6. The transmitter of claim 4, wherein the determinator is formed to write the information of a data set into no more than one partial memory.

7. The transmitter of claim 1, wherein the determinator is formed to determine the error correction data on the basis of an EXCLUSIVE OR combination or to determine the error correction data using a block code algorithm.

8. The transmitter of claim 1, wherein the transmitting unit is formed to combine the data sets into a data stream and to insert the error correction data into the data stream.

9. The transmitter of claim 1, wherein the transmitting unit is formed to associate the data sets with data packets, wherein the transmitting unit is further formed to integrate the offset information associated with a data set into the data packet associated with the data set.

10. The transmitter of claim 1, wherein the information data is present in a first data set and in a second data set, wherein the assigner is formed to assign offset information to the first data set and not to assign offset information to the second data set, and wherein the transmitting unit is formed to transmit the first data set and the second data set.

11. The transmitter of claim 1, wherein information data of a first topicality is present in a first data set and information data of a second topicality different from the first topicality in a second data set, wherein the assigner is formed to assign first topicality information to the first data set and second topicality information to the second data set, and wherein the transmitting unit is formed to transmit the first and the second topicality information.

12. The transmitter of claim 1, wherein the transmitting unit is formed to transmit a first data set with a first number of information data and a second data set with a second number of information data different from the first number of information data.

13. The transmitter of claim 3, wherein the transmitting unit is further formed to transmit information on a memory column number or a memory row number of the memory.

14. A method of transmitting information data present in a plurality of data sets, comprising the steps of:

assigning offset information to one or more data sets of the plurality of data sets, the offset information indicating where a corresponding data set is to be written in a memory of a receiver; and determining error correction data for the correction of a transmission error in one of the plurality of data sets, wherein the determining is done such that the information data of the data sets is re-sorted according to a re-sorting rule, in order to determine the error correction data from the re-sorted information data;

transmitting the plurality of data sets and the offset information associated with the corresponding data sets, wherein the transmitting is done such that the information data is transmitted in non-re-sorted manner; and sending out the error correction data.

15. A computer program with program code for performing, when the computer program is executed on a computer, a method of transmitting information data present in a plurality of data sets, comprising the steps of:

assigning offset information to one or more data sets of the plurality of data sets, the offset information indicating where a corresponding data set is to be written in a memory of a receiver; and determining error correction data for the correction of a transmission error in one of the plurality of data sets, wherein the determining is done such that the information data of the data sets is re-sorted according to a re-sorting rule, in order to determine the error correction data from the re-sorted information data;

transmitting the plurality of data sets and the offset information associated with the corresponding data sets, wherein the transmitting is done such that the information data is transmitted in non-re-sorted manner; and sending out the error correction data.

16. A receiver for receiving information data present in a plurality of data sets, and for receiving offset information associated with a data set, the offset information associated with the corresponding data sets indicating where the data set is to be stored in a memory, comprising:

a first receiving unit for receiving the offset information;
a second receiving unit for receiving error correction data;
the memory;
a processor for processing the received information data to detect a transmission error;
an inserter for inserting a data set into the memory at the location determined by the offset information assigned to the data set;
a corrector for correcting a transmission error in one of the plurality of data sets, wherein the inserter is formed to re-sort the information data of the data sets according to a re-sorting rule, and wherein the corrector is formed to correct the transmission error from the re-sorted information data, using the error correction data; and
wherein the receiver is formed, upon detection of a transmission error in the received information data, to re-sort the information data of data sets according to a re-sorting rule by the corrector and to correct the transmission error from the re-sorted information data in the corrector, using the error correction data, and wherein the receiver is formed to process the non-re-sorted information data upon detection of no transmission error.

17. The receiver of claim 16, wherein the inserter is formed to write the information data of a data set into the memory for re-sorting according to a writing rule, wherein the corrector is further formed to read out the information data stored in the memory from the memory for re-sorting according to a reading rule different from the writing rule.

18. The receiver of claim 17, wherein the memory includes a plurality of memory cells arranged in a plurality of memory rows and a plurality of memory columns, wherein the corrector includes an alteration unit for altering a number of memory cells of the memory, wherein the corrector is further formed to re-sort information data of a first data set of the plurality of data sets using a first number of memory cells and to re-sort information data of a second data set of the plurality of data sets using a second number of memory cells, wherein the first number of memory cells may be different from the second number of memory cells.

19. The receiver of claim 17, wherein the memory comprises a plurality of partial memories, wherein a number of memory columns or a number of memory rows of the memory or of the partial memory may be dependent on a number of information data in a data set.

20. The receiver of claim 19, wherein a number of memory columns of the memory or of a partial memory corresponds to at least the number of information data of that data set having the greatest number of information data.

21. The receiver of claim 19, wherein the inserter is formed to write the information data of a data set into no more than one partial memory.

22. The receiver of claim 16, wherein the corrector is formed to correct the transmission error on the basis of an EXCLUSIVE OR combination or using a block code algorithm.

23. The receiver of claim 16, wherein the inserter is formed to extract the error correction data from a data stream that includes data sets and error correction data.

24. The receiver of claim 16, wherein the data sets and the offset information associated with a data set are embedded in one or more data packets, wherein the first receiving unit is formed to extract the offset information associated with a data set from one or more data packets into which the data set is embedded.

25. The receiver of claim 16, wherein the information data is present in a first data set and in a second data set, wherein offset information is associated with the first data set and no offset information is associated with the second data set, wherein the inserter is formed to insert the first data set at the location in the memory determined by the offset information associated with the first data set and not insert the second data set into the memory.

26. The receiver of claim 16, wherein information data with first topicality information is present in a first data set and information data with second topicality information different from the first topicality information is present in a second data set, wherein the second topicality information indicates higher topicality of the information data of the second data set as opposed to the topicality of the information of the first data set designated by the first topicality information, and wherein the corrector is formed to not correct a transmission error in the first data set and correct a transmission error in the second data set.

27. The receiver of claim 16, which is formed to receive a first data set with a first number of information data and a second data set with a second number of information data different from the first number of information data.

28. The receiver of claim 18, wherein the corrector is further formed to receive information on a memory column number or information on a memory row number of the memory and change the memory depending on the received memory row number or the received memory column number.

29. A method of receiving information data present in a plurality of data sets and for receiving offset information associated with a data set, the offset information associated with the corresponding data sets indicating where the corresponding data set is to be stored in a memory, comprising the steps of:
   receiving the offset information;
   receiving error correction data;
   processing the received information data to detect a transmission error;
   inserting a data set into the memory at the location determined by the offset information associated with the data set;
   correcting a transmission error in one of the plurality of data sets, wherein the correcting includes re-sorting the information data of the data sets according to a re-sorting rule, and wherein the correcting includes correcting the transmission error from the re-sorted information data, using the error correction data; and
   wherein the method includes, upon detection of a transmission error in the received information data, re-sorting the information data of data sets according to a re-sorting rule and correcting the transmission error from the re-sorted information data, using the error correction data, and wherein the method processes the non-re-sorted information data upon detection of no transmission error.

30. A computer program with program code for performing, when the computer program is executed on a computer, a method of receiving information data present in a plurality of data sets and for receiving offset information associated with a data set, the offset information associated with the corresponding data sets indicating where the corresponding data set is to be stored in a memory, comprising the steps of:
   receiving the offset information;
   receiving error correction data;
   processing the received information data to detect a transmission error;
   inserting a data set into the memory at the location determined by the offset information associated with the data set;
   correcting a transmission error in one of the plurality of data sets, wherein the correcting includes re-sorting the information data of the data sets according to a re-sorting rule, and wherein the correcting includes correcting the transmission error from the re-sorted information data, using the error correction data; and
   wherein the method includes, upon detection of a transmission error in the received information data, re-sorting the information data of data sets according to a re-sorting rule and correcting the transmission error from the re-sorted information data, using the error correction data, and wherein the method processes the non-re-sorted information data upon detection of no transmission error.

* * * * *